(12) United States Patent
Mori et al.

(10) Patent No.: US 7,907,009 B2
(45) Date of Patent: Mar. 15, 2011

(54) HIGH FREQUENCY AMPLIFIER

(75) Inventors: Kazutomi Mori, Chiyoda-ku (JP);
Kazuhiro Iyomasa, Chiyoda-ku (JP);
Akira Ohta, Chiyoda-ku (JP); Teruyuki Shimura, Chiyoda-ku (JP); Masatoshi Nakayama, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 46 days.

(21) Appl. No.: 12/514,159

(22) PCT Filed: Nov. 30, 2006

(86) PCT No.: PCT/JP2006/323991
§ 371 (c)(1),
(2), (4) Date: May 8, 2009

(87) PCT Pub. No.: WO2008/068809
PCT Pub. Date: Jun. 12, 2008

(65) Prior Publication Data
US 2010/0033241 A1 Feb. 11, 2010

(51) Int. Cl.
*H03F 3/68* (2006.01)
(52) U.S. Cl. ..................... 330/124 R; 330/295
(58) Field of Classification Search .......... 330/124 R, 330/295, 84, 126, 302, 51
See application file for complete search history.

(56) References Cited

U.S. PATENT DOCUMENTS

| | | | | |
|---|---|---|---|---|
| 5,070,304 A * | 12/1991 | Salib et al. | ............ | 330/54 |
| 5,834,975 A | 11/1998 | Bartlett et al. | | |
| 6,085,074 A * | 7/2000 | Cygan | ............ | 455/241.1 |
| 6,114,911 A * | 9/2000 | Iwai et al. | ............ | 330/295 |
| 6,201,445 B1 * | 3/2001 | Morimoto et al. | ............ | 330/295 |
| 6,252,463 B1 | 6/2001 | Kobayashi | | |
| 6,317,002 B1 * | 11/2001 | Griffiths | ............ | 330/295 |
| 6,650,181 B2 | 11/2003 | Shinjo et al. | | |
| 6,812,794 B1 | 11/2004 | Mori et al. | | |
| 6,873,208 B2 | 3/2005 | Shinjo et al. | | |
| 6,943,624 B2 | 9/2005 | Ohnishi et al. | | |
| 7,586,374 B2 * | 9/2009 | Bouny | ............ | 330/295 |

(Continued)

FOREIGN PATENT DOCUMENTS

EP 0 687 060 A2 12/1995

(Continued)

OTHER PUBLICATIONS

Kim, Ji Hoon et al., "A Power Efficient W-CDMA Smart Power Amplifier With Emitter Area Adjusted For Output Power Levels", International Microwave Symposium, IEEE MTT-S Digest, pp. 1165-1168, (2004).

(Continued)

*Primary Examiner* — Henry K Choe
(74) *Attorney, Agent, or Firm* — Oblon, Spivak, McClelland, Maier & Neustadt, L.L.P.

(57) ABSTRACT

Provided is a high frequency amplifier including two amplifying elements of different element sizes connected in parallel and switching the amplifying elements in accordance with a level of output power. In particular, the high frequency amplifier includes an output matching circuit for matching to characteristic impedance (50 ohms) both when the output power is high and low, and increasing impedance when the turned-off amplifying element is viewed from a connection node on an output side of the two amplifying elements. Consequently, characteristics such as high output power and high efficiency can be achieved and it is possible to prevent an amplified high frequency signal from passing around to a matching circuit on a turned-off amplifying element side.

3 Claims, 15 Drawing Sheets

U.S. PATENT DOCUMENTS

| | | |
|---|---|---|
| 2002/0055376 A1 | 5/2002 | Norimatsu |
| 2002/0186076 A1 | 12/2002 | Hareyama |
| 2003/0025555 A1 | 2/2003 | Ohnishi et al. |
| 2003/0048132 A1 | 3/2003 | Kagaya et al. |
| 2006/0001484 A1 | 1/2006 | Paul et al. |

FOREIGN PATENT DOCUMENTS

| | | |
|---|---|---|
| JP | 2000 278109 | 10/2000 |
| JP | 2000 349574 | 12/2000 |
| JP | 2001 185962 | 7/2001 |
| JP | 2002 353751 | 12/2002 |
| JP | 2003 46340 | 2/2003 |
| JP | 2004 134823 | 4/2004 |
| JP | 2006 311300 | 11/2006 |
| WO | 01 59927 | 8/2001 |

OTHER PUBLICATIONS

European Patent Appln. No. 06 833 794.8, European Extended Search Report, dated Dec. 13, 2010, pp. 1-4.

* cited by examiner

HIGH FREQUENCY AMPLIFIER

TECHNICAL FIELD

The present invention relates to a high frequency amplifier in which two amplifying elements having different sizes are connected in parallel to each other, and the amplifying elements are switched in accordance with high or low output power. In particular, the present invention relates to an output matching circuit that is matched to be a characteristic impedance (50 ohms) in any cases of high and low output powers so that the impedance of a turned-off amplifying element viewed from an output-side connection node of the two amplifying elements is set to be a high value.

BACKGROUND ART

The high frequency amplifier usually has such characteristics that the efficiency increases as the output level becomes close to a saturation level. On the contrary, there is a problem in that the efficiency is low when the output level is low. For instance, if the high frequency amplifier is used in a system having a wide dynamic range of the output power, the efficiency in a low output power becomes low. In this case, it is a task to enhance the efficiency in a low output power.

A conventional high frequency amplifier is devised to enhance the efficiency in a low output power like a high frequency amplifier disclosed in Non Patent Document 1, for example, by connecting amplifiers having different sizes in parallel to each other and by switching the amplifiers in accordance with the output level so that an amplifier having a larger size is activated if the output level is high while the other amplifier having a smaller size is activated if the output level is low.

In addition, Patent Document 1 discloses a method of switching a size of the amplifier by using a switch made up of transistors.

In addition, Patent Document 2 discloses an output matching circuit in which an output impedance of an amplifier is matched to be a characteristic impedance of 50 ohms (Ω) in any case when the amplifier is switched.

In addition, Patent Document 3 discloses a devised structure for enhancing the efficiency in a low output power by controlling a collector voltage of an amplifier. It also discloses a devised structure for enhancing the efficiency in a low output power by changing an output matching circuit with a switch simultaneously when a size of the amplifier is changed.

In addition, Patent Document 4 discloses a devised structure for enhancing the efficiency in a low output power by switching an output matching circuit with a switch when a size of the amplifier is changed.

Further, Patent Document 5 discloses a devised structure of an amplifier in which sizes of two stages of amplifiers are switched in accordance with an output level. A switch is provided between the stages of amplifiers, and a switch provided to the amplifier to be turned off is switched off so that isolation is enhanced for suppressing an oscillation.

Patent Document 1: JP 2000-278109 A
Patent Document 2: JP 2003-046340 A
Patent Document 3: JP 2002-353751 A
Patent Document 4: JP 2004-134823 A
Patent Document 5: JP 2003-087059 A
Non Patent Document 1: J. H. Kim, etc., "A Power Efficient W-CDMA Smart Power Amplifier With Emitter Area Adjusted For Output Power Levels", 2004 IEEE International Microwave Symposium (MTT-S) Digest, pp. 1165-1168.

DISCLOSURE OF THE INVENTION

Problems to be Solved by the Invention

The conventional high frequency amplifiers disclosed in Non Patent Document 1 and Patent Document 1 have a problem that an output load impedance is not optimized so that the characteristics are deteriorated when the amplifier is switched, because matching circuits for the two amplifiers are the same matching circuit. In addition, there is a problem that an impedance of the turned-off amplifier affects a loss in the output matching circuit to increase, and hence characteristics such as the output power and the efficiency are deteriorated. Further, there is a problem that the high frequency signal may pass around the turned-off amplifier and cause an oscillation because of insufficient isolation of the turned-off amplifier.

Patent Document 2 describes that the conventional high frequency amplifier is matched to have the output characteristic impedance when the amplifier is switched in any case. However, it has a problem that the impedance of the turned-off amplifier affects the loss in the output matching circuit to increase so that the characteristics such as the output power and the efficiency are deteriorated. In addition, there is a problem that the high frequency signal may pass around the turned-off amplifier and cause an oscillation because of insufficient isolation of the turned-off amplifier.

Patent Documents 3 and 4 describe that the matching circuit is also switched with the switch simultaneously when the amplifier is switched, and hence it is matched to the output characteristic impedance in any case. However, the switch is used, and hence there are problems that a circuit size increases and that a loss in the switch causes an increase of a loss in the output matching circuit so that the characteristics such as the output power and the efficiency are deteriorated. In addition, there is a problem that the impedance of the turned-off amplifier affects a loss in the output matching circuit to increase so that the characteristics such as the output power and the efficiency are deteriorated. Further, there is a problem that the high frequency signal may pass around the turned-off amplifier and cause an oscillation because of insufficient isolation of the turned-off amplifier.

The conventional high frequency amplifier described in Patent Document 5 includes the amplifier to be switched that is made up of two stages of amplifiers and the switch disposed between the two stages of amplifiers. When the amplifier is turned off, the switch is also turned off so that sufficient isolation can be obtained. Thus, it is avoided that the high frequency signal passes around the turned-off amplifier and causes an oscillation. However, the switch is provided, and hence there is a problem that the circuit size increases. In addition, there is a problem that the output load impedance is not optimized so that the characteristics are deteriorated when the amplifier is switched. Further, there is a problem that the impedance of the turned-off amplifier affects a loss in the output matching circuit to increase so that the characteristics such as the output power and the efficiency are deteriorated.

The present invention has been made to solve the problems described above, and therefore an object thereof is to obtain a high frequency amplifier that can be matched to a characteristic impedance of 50 ohms (Ω) in any cases of high and low output powers, and hence as to realize characteristics such as high output power and high efficiency.

In addition, it is an object to obtain a high frequency amplifier that can prevent the amplified high frequency signal from passing around the turned-off amplifying element to the matching circuit, can reduce a loss in the output matching circuit, can enhance isolation between the input and the output of the turned-off amplifying element side, and can suppress the oscillation due to the signal passing around the turned-off amplifying element.

Means for Solving the Problems

A high frequency amplifier according to the present invention includes: a first amplifying element for amplifying a high frequency signal input from an input terminal; a second amplifying element for amplifying the high frequency signal, which is connected in parallel to the first amplifying element and has a smaller element size than the first amplifying element has; a first bias control circuit for turning on and off the first amplifying element based on a mode switching voltage for switching between a case where an output power is high and a case where the output power is low; a second bias control circuit for turning on and off the second amplifying element based on the mode switching voltage; and an output matching circuit connected to output sides of the first amplifying element and the second amplifying element. The output matching circuit includes: a first matching circuit connected to the output side of the first amplifying element; a second matching circuit connected to the output side of the second amplifying element; and a third matching circuit connected between an output terminal and a connection node of the output sides of the first matching circuit and the second matching circuit, which is matched to 50 ohms. The first matching circuit comprises: a first high pass filter type matching circuit connected to the output side of the first amplifying element; and a serial inductor connected to the first high pass filter type matching circuit. The second matching circuit comprises a second high pass filter type matching circuit connected to the output side of the second amplifying element. A first impedance of the first matching circuit viewed from the connection node in the case where the output power is high that is a case where the first amplifying element is turned on while the second amplifying element is turned off is substantially the same as a second impedance of the second matching circuit viewed from the connection node in the case where the output power is low that is a case where the second amplifying element is turned on while the first amplifying element is turned off. The second impedance of the second matching circuit viewed from the connection node is higher than the first impedance of the first matching circuit viewed from the connection node in the case where the output power is high that is in the case where the first amplifying element is turned on while the second amplifying element is turned off. The first impedance of the first matching circuit viewed from the connection node is higher than the second impedance of the second matching circuit viewed from the connection node in the case where the output power is low that is the case where the second amplifying element is turned on while the first amplifying element is turned off.

EFFECTS OF THE INVENTION

The high frequency amplifier according to the present invention has such an effect that it can be matched to a characteristic impedance of 50 ohms ($\Omega$) in any cases of high and low output powers, and hence characteristics such as high output power and high efficiency can be realized. In addition, it has effects of preventing the amplified high frequency signal from passing around the turned-off amplifying element to the matching circuit, reducing a loss in the output matching circuit, enhancing isolation between the input and the output of the turned-off amplifying element side, and suppressing the oscillation due to the signal passing around the turned-off amplifying element.

BEST MODE FOR CARRYING OUT THE INVENTION

Hereinafter, high frequency amplifiers according to Embodiments 1 to 8 of the present invention are described.

Embodiment 1

Figure 1:
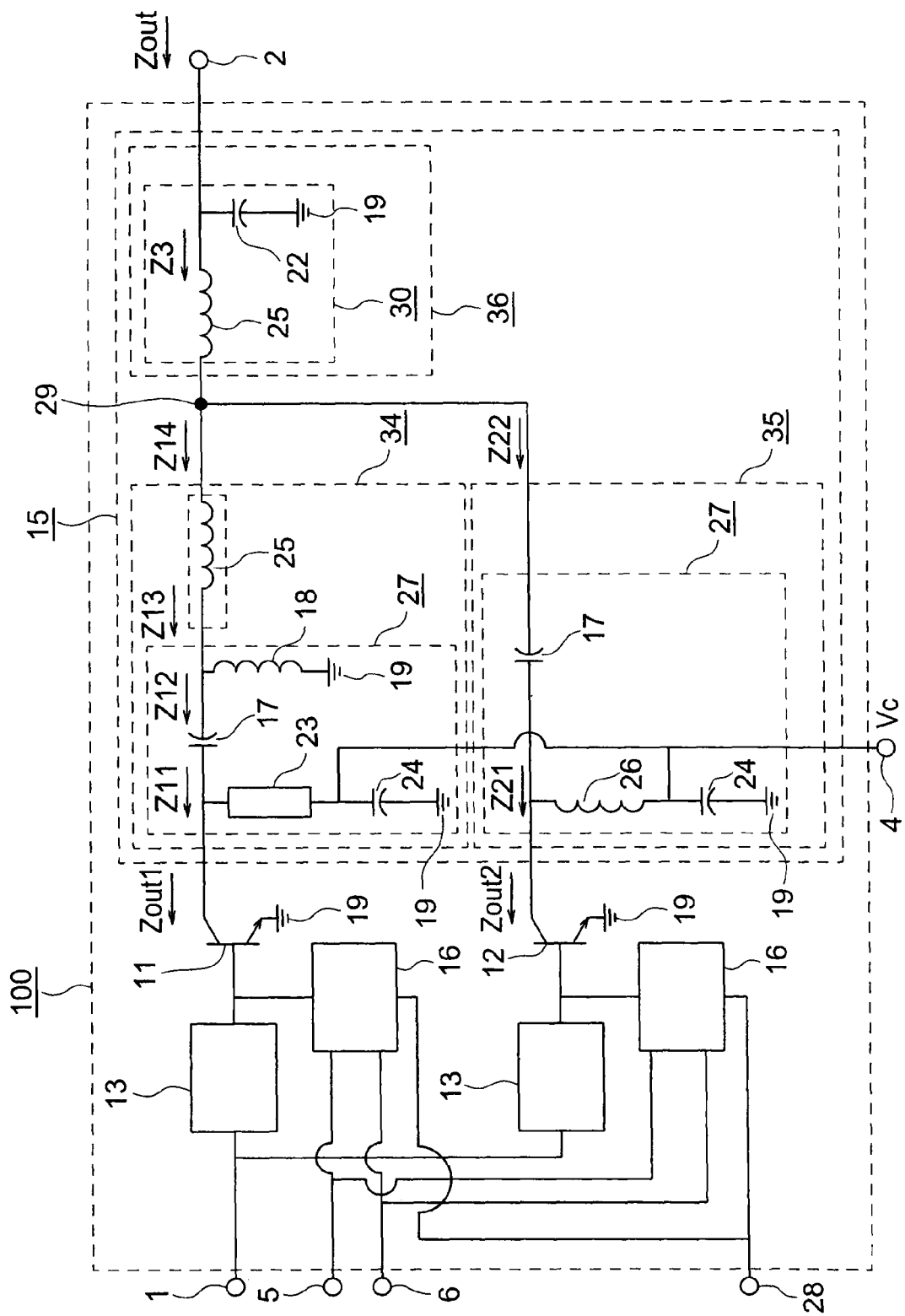
FIG. 1 is a circuit diagram illustrating a structure of a high frequency amplifier according to Embodiment 1 of the present invention.

A high frequency amplifier according to Embodiment 1 of the present invention is described with reference to FIGS. 1 to 4. FIG. 1 is a circuit diagram illustrating a structure of the high frequency amplifier according to Embodiment 1 of the present invention. Note that the same reference symbols in the individual diagrams denote the same element or equivalent elements in the following description.

In FIG. 1, a high frequency amplifier 100 according to Embodiment 1 includes an input terminal 1, an output terminal 2, a collector (drain) bias terminal 4, a base (gate) bias setting terminal 5, and a mode switching terminal 6.

In addition, the high frequency amplifier 100 includes a high output power last phase amplifying element (first amplifying element) 11, a low output power last phase amplifying element (second amplifying element) 12, two input matching circuits 13, an output matching circuit 15, and two base (gate) bias control circuits (first and second bias control circuits) 16. Note that each of the two base (gate) bias control circuits 16 is connected to a power source terminal 28.

The output matching circuit 15 includes a first matching circuit 34, a second matching circuit 35, and a third matching circuit 36. Note that the first and second matching circuits 34 and 35 are connected to the third matching circuit 36 via a connection node 29.

The first matching circuit 34 includes a high pass filter type matching circuit (first high pass filter type matching circuit) 27 and a serial inductor 25. In addition, the high pass filter type matching circuit 27 includes a short stub made up of a collector (drain) bias line 23 and a bypass capacitor 24, a serial capacitor 17, and a parallel inductor 18. Note that an end of each of the bypass capacitor 24 and the parallel inductor 18 is connected to a ground 19.

The second matching circuit 35 includes a high pass filter type matching circuit (second high pass filter type matching circuit) 27. In addition, the high pass filter type matching circuit 27 includes a collector (drain) bias applying inductor 26, the bypass capacitor 24, and the serial capacitor 17. Note that an end of the bypass capacitor 24 is connected to the ground 19.

The third matching circuit 36 includes a low pass filter type matching circuit 30. In addition, the low pass filter type matching circuit 30 includes the serial inductor 25 and a parallel capacitor 22. Note that an end of the parallel capacitor 22 is connected to the ground 19.

Here, before describing an operation of the high frequency amplifier, complex impedance ($Z=R+jX$) [Ω] on a Smith chart is described. FIGS. 2 and 3A-3E are diagrams for illustrating impedance on the Smith chart.

Figure 2:
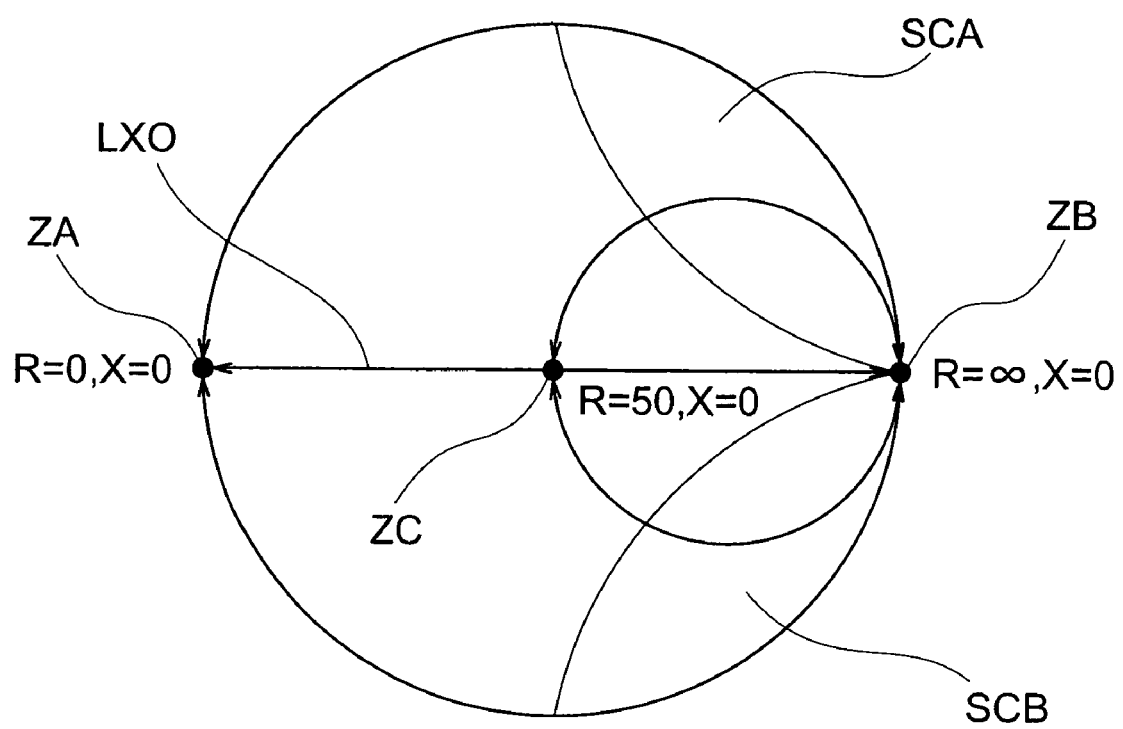
FIG. 2 is a diagram for illustrating impedance on a Smith chart.

In FIG. 2, impedance on a semicircle SCA upper than a line LX0 of X=0 is inductive impedance. In other words, if "X>0" holds with respect to "$X=j\omega L>0$", it is inductive impedance. In addition, impedance on a semicircle SCB lower than the line LX0 of X=0 is capacitive impedance. In other words, if "X<0" holds with respect to "$X=1/(j\omega C)=-j/\omega C<0$", it is capacitive impedance. The impedance decreases as going to the left side, and a left end point ZA has impedance Z=0 (R=0, X=0). The impedance increases as going to the right side, and a right endpoint ZB has impedance Z=∞ (infinite value) (R=∞, X=0). Note that though X=±∞ precisely when Z=∞, it is regarded that X=0 for convenience sake. Further, a middle point ZC between the left end point ZA and the right end point ZB has an impedance value Z=50 (ohms) (R=50, X=0). This point ZC is the center of a large circle.

Figure 3A:
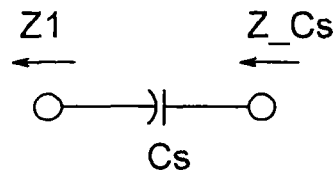
FIGS. 3A-3E are a diagram for illustrating impedance on the Smith chart.
Figure 3B:
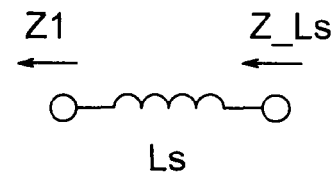
Figure 3C:
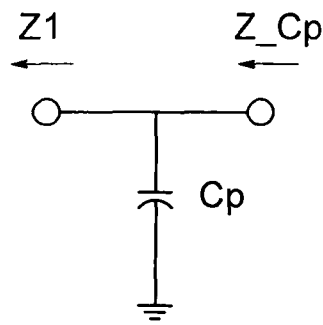
Figure 3D:
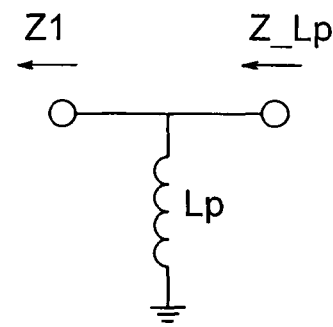
Figure 3E:
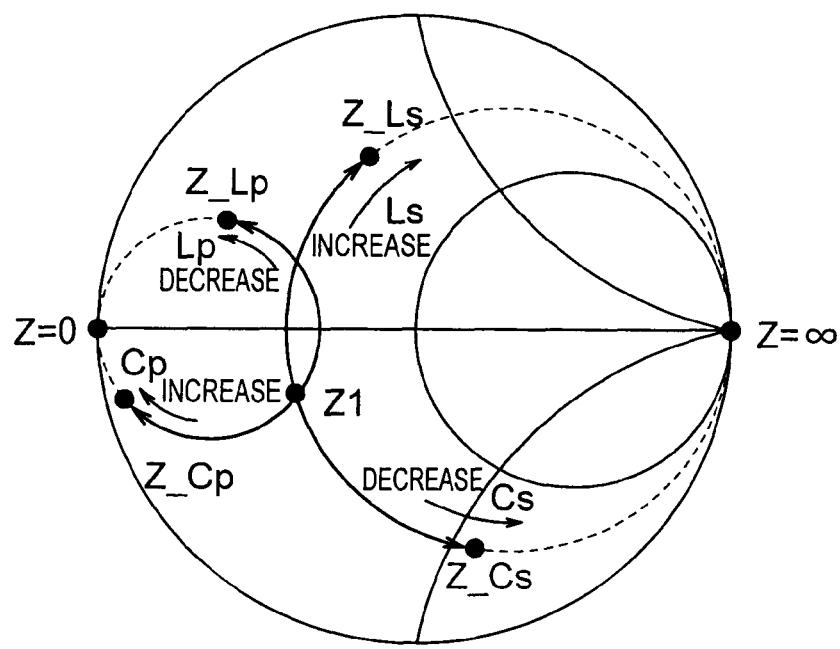

With reference to FIGS. 3A-3E, in the case of a serial capacitor Cs illustrated in FIG. 3A, the point of impedance Z_Cs viewed from the right terminal moves in a counterclockwise manner on a circle passing through the points of the impedance Z1 and Z=∞ (ZB) as the serial capacitor Cs decreases as illustrated in FIG. 3E. In the case of a serial inductor Ls illustrated in FIG. 3B, the point of impedance Z_Ls viewed from the right terminal moves in a clockwise manner on a circle passing through the points of the impedance Z1 and Z=∞ (ZB) as the serial inductor Ls increases as illustrated in FIG. 3E. In the case of a parallel capacitor Cp illustrated in FIG. 3C, the point of impedance Z_Cp viewed from the right terminal moves in a clockwise manner on a circle passing through the points of the impedance Z1 and Z=0 (ZA) as the parallel capacitor Cp increases as illustrated in FIG. 3E. In the case of a parallel inductor Lp illustrated in FIG. 3D, the point of impedance Z_Lp viewed from the right terminal moves in a counterclockwise manner on a circle passing through the points of the impedance Z1 and Z=0 (ZA) as the parallel inductor Lp decreases as illustrated in FIG. 3E.

Next, an operation of the high frequency amplifier according to Embodiment 1 is described with reference to the drawings. FIGS. 4A-4D are Smith charts illustrating impedance of the output matching circuit of the high frequency amplifier according to Embodiment 1 of the present invention.

The high frequency amplifier 100 includes the high output power last phase amplifying element 11, the low output power last phase amplifying element 12, the two input matching circuits 13, the output matching circuit 15, and the two base (gate) bias control circuits 16 as illustrated in FIG. 1. An element size of the high output power last phase amplifying element 11 is larger than a size of the low output power last phase amplifying element 12.

The amplifying elements 11 and 12 are made up of a bipolar transistor such as a heterobipolar transistor (HBT) or a bipolar junction transistor (BJT), or a field effect transistor (FET) such as a metal-semiconductor FET (MESFET) or a high electron mobility transistor (HEMT).

The high output power last phase amplifying element 11 is supplied with a collector bias voltage that is applied to the collector (drain) bias terminal 4 from the bypass capacitor 24 side via the collector (drain) bias line 23. In addition, the low output power last phase amplifying element 12 is supplied with a collector bias voltage that is applied to the collector (drain) bias terminal 4 from the bypass capacitor 24 side via the collector (drain) bias applying inductor 26. Here, the collector (drain) bias applying inductor 26 may be used instead of the collector (drain) bias line 23, and vice versa. Specifically, the collector (drain) bias line 23 may be used instead of the collector (drain) bias applying inductor 26. In addition, the collector (drain) bias line 23 and the collector (drain) bias applying inductor 26 work also as matching elements.

A base (gate) bias voltage of the amplifying element 11 or 12 is supplied from the voltage that is applied to the base (gate) bias setting terminal 5 via the base (gate) bias control circuit 16. The base (gate) bias control circuit 16 includes a bias circuit for converting the voltage applied to the base (gate) bias setting terminal 5 into the base (gate) voltage to be applied to the amplifying element 11 or 12. A power source voltage of the base (gate) bias control circuit 16 is supplied from the power source terminal 28.

The base (gate) bias control circuit 16 sets the base (gate) voltage of the high output power last phase amplifying element 11 so as to turn on the high output power last phase amplifying element 11 if the output power of the high frequency amplifier 100 is high based on a mode switching voltage for switching cases of the high output power and the low output power applied to the mode switching terminal 6. In addition, the base (gate) bias control circuit 16 sets the base (gate) voltage of the low output power last phase amplifying element 12 so as to turn off the low output power last phase amplifying element 12.

On the contrary, the base (gate) bias control circuit 16 sets the base (gate) voltage of the low output power last phase amplifying element 12 so as to turn on the low output power last phase amplifying element 12 if the output power of the high frequency amplifier 100 is low based on the mode switching voltage that is applied to the mode switching terminal 6. In addition, the base (gate) bias control circuit 16 sets the base (gate) voltage of the high output power last phase amplifying element 11 so as to turn off the high output power last phase amplifying element 11.

The high frequency signal input from the input terminal 1 is amplified by the high output power last phase amplifying element 11 via the input matching circuit 13 if the output power of the high frequency amplifier 100 is high. After that, it is matched by the first matching circuit 34 to medium impedance between impedance of the amplifying element 11 and 50 ohms (Ω) that is input and output characteristic impedance of the high frequency amplifier 100. After that, it is matched by the third matching circuit 36 to 50 ohms (Ω) that is the characteristic impedance and is output from the output terminal 2.

The first matching circuit 34 is made up of the high pass filter type matching circuit 27 and the serial inductor 25 as described above. The high pass filter type matching circuit 27 is made up of the short stub including the collector (drain) bias line 23 and the bypass capacitor 24, the serial capacitor 17, and the parallel inductor 18. In addition, the third matching circuit 36 is made up of the low pass filter type matching circuit 30. The low pass filter type matching circuit 30 is made up of the serial inductor 25 and the parallel capacitor 22.

Here, the case where the third matching circuit 36 is a single stage of the ladder low pass filter type matching circuit 30 is described, but it may have any circuit structure as long as the matching circuit can match the medium impedance to be 50 ohms (Ω). Therefore, it may be a multistage low pass filter type matching circuit, a single stage or multistage high pass filter type matching circuit, or a matching circuit as a combination of the low pass filter type matching circuit and the high pass filter type matching circuit.

If the output power of the high frequency amplifier 100 is low, the high frequency signal supplied to the input terminal 1 passes through the input matching circuit 13 and is amplified by the low output power last phase amplifying element 12. After that, it is matched by the second matching circuit 35 to medium impedance between impedance of the amplifying element 12 and 50 ohms (Ω) that is input and output characteristic impedance of the high frequency amplifier 100. After that, it is matched by the third matching circuit 36 to 50 ohms (Ω) that is characteristic impedance and is output from the output terminal 2.

The second matching circuit 35 is made up of the high pass filter type matching circuit 27 as described above. The high pass filter type matching circuit 27 is made up of the circuit including the collector (drain) bias applying inductor 26 and the bypass capacitor 24, and the serial capacitor 17.

Note that the circuit illustrated in FIG. 1 is made up mainly of lumped constant elements, but it is possible that the serial inductor 25 is made up of serial lines using a distributed constant circuit. In addition, the parallel capacitor 22 may be made up of an open stab, and the parallel inductor 18 may be made up of a short stub.

Here, there is a request for the first matching circuit 34 and the second matching circuit 35 concerning the impedance viewed from the connection node 29 between the first matching circuit 34 and the second matching circuit 35. A "first condition" is that the impedance (first impedance) of the first matching circuit 34 viewed from the connection node 29 in the case where the output power is high, i.e., the case where the high output power last phase amplifying element 11 is turned on while the low output power last phase amplifying element 12 is turned off is substantially the same as the impedance (second impedance) of the second matching circuit 35 viewed from the connection node 29 in the case where the output power is low, i.e., the case where the low output power last phase amplifying element 12 is turned on while the high output power last phase amplifying element 11 is turned off. Thus, an output impedance Zout of the high frequency amplifier 100 can be matched to 50 ohms (Ω) by the third matching circuit 36 in any case when the amplifying elements 11 and 12 are switched in accordance with a level of the output power.

A "second condition" is that the impedance (second impedance) of the second matching circuit 35 viewed from the connection node 29 in the case where the output power is high, i.e., the case where the high output power last phase amplifying element 11 is turned on while the low output power last phase amplifying element 12 is turned off is sufficiently higher than the impedance (first impedance) of the first matching circuit 34 viewed from the connection node 29 in the case where the output power is high. Thus, the high frequency signal that is amplified by the high output power last phase amplifying element 11 and then flows to the connection node 29 via the first matching circuit 34 does not pass around to the second matching circuit 35, and it is output from the output terminal 2 through the third matching circuit 36.

Therefore, a loss generated by the high frequency signal that passes around to the second matching circuit 35 in the output matching circuit 15 can be reduced, and hence the characteristics such as the output power and the efficiency can be enhanced in the case where the output power is high. At the same time, the high frequency signal does not pass around to the second matching circuit 35, and hence the oscillation generated by a feedback of the high frequency signal amplified by the high output power last phase amplifying element 11 to the input side via the low output power last phase amplifying element 12 that is turned off can be suppressed in the case where the output power is high. In other words, isolation between the input and the output of the circuit on the side of the low output power last phase amplifying element 12 that is turned off can be enhanced so that the oscillation can be suppressed.

A "third condition" is that the impedance (first impedance) of the first matching circuit 34 viewed from the connection node 29 in the case where the output power is low, i.e., the case where the low output power last phase amplifying element 12 is turned on while the high output power last phase amplifying element 11 is turned off is sufficiently higher than the impedance (second impedance) of the second matching circuit 35 viewed from the connection node 29 in the case where the output power is low. Thus, the high frequency signal that is amplified by the low output power last phase amplifying element 12 and flows to the connection node 29 via the second matching circuit 35 does not pass around to the first matching circuit 34 but is output from the output terminal 2 via the third matching circuit 36.

Therefore, the loss generated by the high frequency signal that passes around to the first matching circuit 34 in the output matching circuit 15 can be reduced, and hence the characteristics such as the output power and the efficiency in the case where the output power is low can be enhanced. At the same time, the high frequency signal does not pass around to the first matching circuit 34, and hence the oscillation generated by a feedback of the high frequency signal amplified by the low output power last phase amplifying element 12 to the input side via the high output power last phase amplifying element 11 that is turned off can be suppressed in the case where the output power is low. In other words, isolation between the input and the output of the circuit on the side of the high output power last phase amplifying element 11 that is turned off can be enhanced so that the oscillation can be suppressed.

Figure 4A:
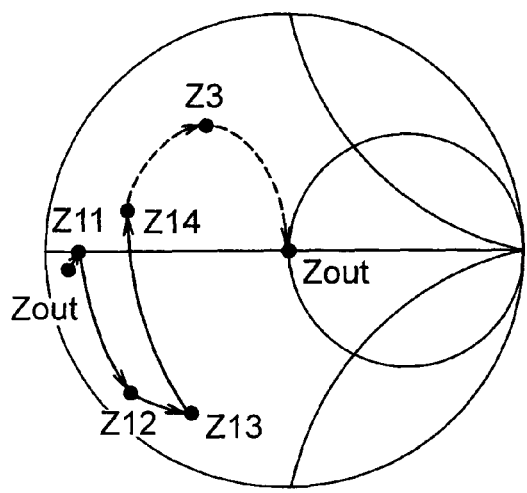
FIGS. 4A-4D are Smith charts illustrating impedance of an output matching circuit of the high frequency amplifier according to Embodiment 1 of the present invention.
Figure 4B:
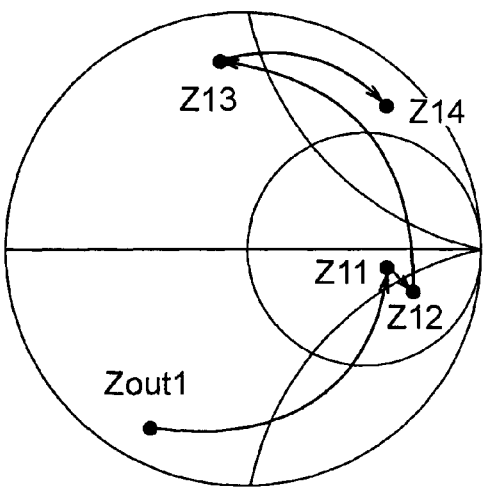
Figure 4C:
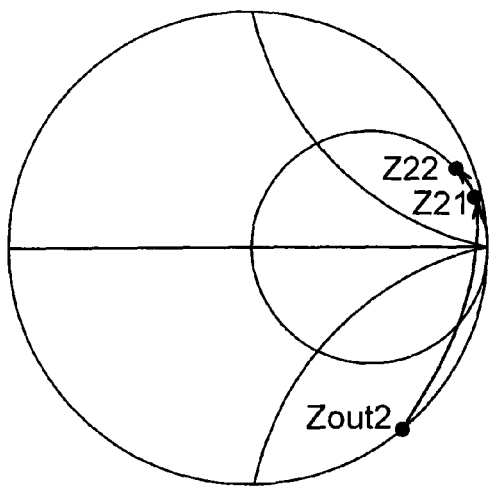
Figure 4D:
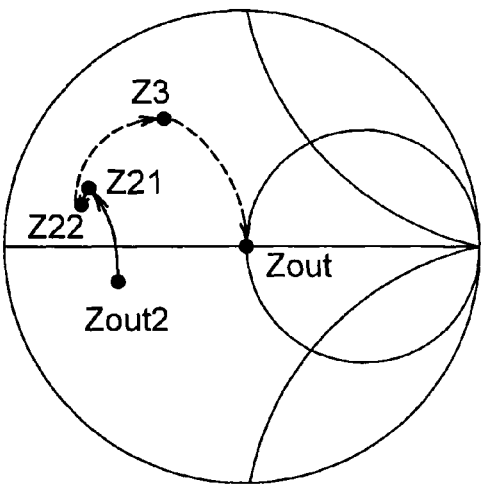

Here, an operation of the output matching circuit 15 of the high frequency amplifier 100 illustrated in FIG. 1 is described. FIGS. 4A and 4B illustrate loci of impedance of the first matching circuit 34 viewed from the connection node 29 in the case where the output power is high and in the case where it is low, respectively, with full line arrows. FIGS. 4C and 4D illustrate loci of impedance of the second matching circuit 35 viewed from the connection node 29 in the case where the output power is high and in the case where it is low, respectively, with full line arrows. In addition, a locus of impedance of the circuit from the connection node 29 to the output terminal 2 is also illustrated with a dotted line arrow. In FIGS. 4A-4D, Zout1, Z11, Z12, Z13, Z14, Zout2, Z21, Z22, Z3 and Zout respectively denote impedances viewed from positions indicated on the circuit diagram of FIG. 1.

FIG. 4A is a diagram illustrating impedance of the first matching circuit 34 viewed from the connection node 29 in the case where the output power is high. FIG. 4B is a diagram illustrating impedance of the first matching circuit 34 viewed from the connection node 29 in the case where the output power is low. FIG. 4C is a diagram illustrating impedance of the second matching circuit 35 viewed from the connection node 29 in the case where the output power is high. FIG. 4D is a diagram illustrating impedance of the second matching circuit 35 viewed from the connection node 29 in the case where the output power is low.

With reference to FIGS. 4A and 4D, it is understood that Z14 that is impedance of the first matching circuit 34 viewed from the connection node 29 in the case where the output power is high is substantially the same as Z22 that is impedance of the second matching circuit 35 viewed from the connection node 29 in the case where the output power is low. Therefore, the above-mentioned "first condition" can be satisfied. Thus, the output impedance Zout of the high frequency amplifier 100 can be matched to 50 ohms ($\Omega$) by the third matching circuit 36 in any case when the amplifying elements 11 and 12 are switched in accordance with a level of the output power. Therefore, the high frequency amplifier 100 can realize characteristics such as high output power and high efficiency in any cases where the output power is high and where it is low.

With reference to FIGS. 4C and 4A, it is understood that Z22 that is impedance of the second matching circuit 35 viewed from the connection node 29 in the case where the output power is high is sufficiently higher than Z14 that is impedance of the first matching circuit 34 viewed from the connection node 29 in the case where the output power is high. Therefore, the above-mentioned "second condition" can be satisfied. Thus, the loss due to the high frequency signal that passes around to the second matching circuit 35 in the output matching circuit 15 can be reduced, and hence characteristics such as the high output power and high efficiency can be realized in the case where the output power is high. At the same time, the high frequency signal does not pass around to the second matching circuit 35, and hence the oscillation generated by a feedback of the high frequency signal amplified by the high output power last phase amplifying element 11 to the input side via the low output power last phase amplifying element 12 that is turned off can be suppressed in the case where the output power is high. In other words, isolation between the input and the output of the circuit or a side of the low output power last phase amplifying element 12 that is turned off can be enhanced so that the oscillation can be suppressed.

Here, a method of increasing Z22 that is impedance of the second matching circuit 35 viewed from the connection node 29 in the case where the output power is high is described. The output impedance Zout2 when the low output power last phase amplifying element 12 is turned off is capacitive impedance as illustrated in FIG. 4C, and hence the second matching circuit 35 can increase the impedance Z22 viewed from the connection node 29 by using a high pass filter type matching element such as the collector (drain) bias applying inductor 26 or the serial capacitor 17. In this way, it is necessary to dispose the high pass filter type matching circuit 27 on the connection node 29 side of the second matching circuit 35.

It is understood from FIGS. 4B and 4D that Z14 that is impedance of the first matching circuit 34 viewed from the connection node 29 in the case where the output power is low is sufficiently higher than Z22 that is impedance of the second matching circuit 35 viewed from the connection node 29 in the case where the output power is low. Therefore, the above-mentioned "third condition" can be satisfied. Thus, the loss generated by the high frequency signal passing around to the first matching circuit 34 in the output matching circuit 15 can be reduced, and hence characteristics such as the high output power and high efficiency can be realized in the case where the output power is low. At the same time, the high frequency signal does not pass around to the first matching circuit 34, and hence the oscillation generated by a feedback of the high frequency signal amplified by the low output power last phase amplifying element 12 to the input side via the high output power last phase amplifying element 11 that is turned off can be suppressed in the case where the output power is low. In other words, isolation between the input and the output of the circuit on a side of the high output power last phase amplifying element 11 that is turned off can be enhanced, and hence the oscillation can be suppressed.

Here, a method of increasing Z14 that is impedance of the first matching circuit 34 viewed from the connection node 29 in the case where the output power is low is described. The output impedance Zout1 when the high output power last phase amplifying element 11 is turned off is capacitive impedance as illustrated in FIG. 4B, and hence the first matching circuit 34 can increase the impedance Z14 viewed from the connection node 29 by providing the short stub made up of the collector (drain) bias line 23 and the bypass capacitor 24, or the high pass filter type matching circuit 27 made up of a high pass filter type matching element such as the serial capacitor 17 and the parallel inductor 18. When the impedance is increased by the high pass filter type matching circuit 27, it becomes the inductive impedance (Z13). Therefore, the serial inductor 25 is disposed at the position that is closest to the connection node 29, and hence the impedance is further increased. In this way, it is necessary to dispose the high pass filter type matching circuit 27 and the serial inductor 25 on the connection node 29 side of the first matching circuit 34.

According to Embodiment 1, the high frequency amplifier 100 illustrated in FIG. 1 includes the first matching circuit 34 disposed on the output side of the high output power last phase amplifying element 11, the second matching circuit 35 disposed on the output side of the low output power last phase amplifying element 12 and the third matching circuit 36 disposed on the post stage thereof. Therefore, it can be matched to the characteristic impedance of 50 ohms ($\Omega$) in any cases of high and low output powers, and hence characteristics such as the high output power and high efficiency can be realized as the high frequency amplifier.

In addition, the impedance of the matching circuit on the turned-off amplifying element side viewed from the connection node 29 can be sufficiently higher than the impedance of the matching circuit on the turned-on amplifying element side viewed from the connection node 29 in any cases of high and low output powers. Therefore, it is possible to prevent the amplified high frequency signal from passing around to the matching circuit on the turned-off amplifying element side, and hence a loss in the output matching circuit 15 can be reduced, whereby characteristics such as the high output power and high efficiency can be realized as the high frequency amplifier. Further, isolation between the input and the output on the turned-off amplifying element side can be enhanced, and the oscillation due to the signal passing around the turned-off amplifying element can be suppressed.

Embodiment 2

Figure 5:
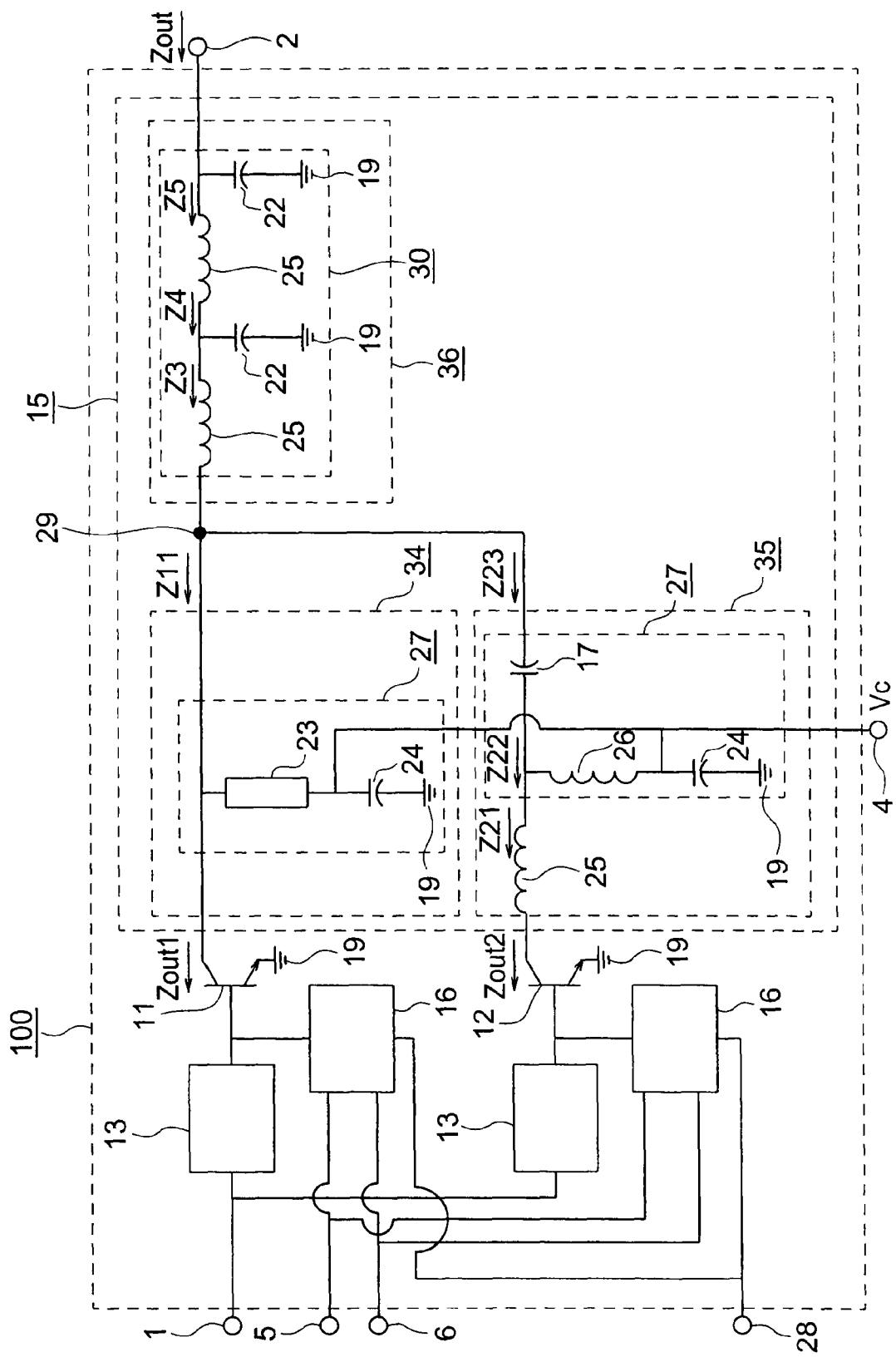
FIG. 5 is a circuit diagram illustrating a structure of a high frequency amplifier according to Embodiment 2 of the present invention.

A high frequency amplifier according to Embodiment 2 of the present invention is described with reference to FIGS. 5 and 6A-6D. FIG. 5 is a circuit diagram illustrating a structure of the high frequency amplifier according to Embodiment 2 of the present invention.

In FIG. 5, a high frequency amplifier 100 according to Embodiment 2 includes an input terminal 1, an output terminal 2, a collector (drain) bias terminal 4, a base (gate) bias setting terminal 5, and a mode switching terminal 6.

In addition, the high frequency amplifier 100 includes a high output power last phase amplifying element (first amplifying element) 11, a low output power last phase amplifying element (second amplifying element) 12, two input matching circuits 13, an output matching circuit 15, and two base (gate) bias control circuits (first and second bias control circuits) 16. An element size of the high output power last phase amplifying element 11 is larger than a size of the low output power last phase amplifying element 12. Note that each of the two base (gate) bias control circuits 16 is connected to a power source terminal 28.

The output matching circuit 15 includes a first matching circuit 34, a second matching circuit 35, and a third matching circuit 36. Note that the first and second matching circuits 34 and 35 are connected to the third matching circuit 36 via a connection node 29.

The first matching circuit 34 includes a high pass filter type matching circuit (first high pass filter type matching circuit) 27. In addition, the high pass filter type matching circuit 27 includes a short stub made up of a collector (drain) bias line 23 and a bypass capacitor 24. Note that an end of the bypass capacitor 24 is connected to a ground 19.

The second matching circuit 35 includes a serial inductor 25 and a high pass filter type matching circuit (second high pass filter type matching circuit) 27. In addition, the high pass filter type matching circuit 27 includes a collector (drain) bias applying inductor 26, the bypass capacitor 24, and a serial capacitor 17. Note that an end of the bypass capacitor 24 is connected to the ground 19.

The third matching circuit 36 includes a low pass filter type matching circuit 30. In addition, the low pass filter type matching circuit 30 includes two stages of circuits made up of the serial inductor 25 and a parallel capacitor 22. Note that an end of each of the two parallel capacitors 22 is connected to the ground 19.

The high frequency amplifier 100 of Embodiment 2 illustrated in FIG. 5 is different from the high frequency amplifier 100 of Embodiment 1 illustrated in FIG. 1 in that the first matching circuit 34 is made up of only the high pass filter type matching circuit 27 and that the high pass filter type matching circuit 27 is made up of only the short stub including the collector (drain) bias line 23 and the bypass capacitor 24.

In addition, it is also different in that the second matching circuit 35 is made up of the serial inductor 25 and the high pass filter type matching circuit 27.

Further, it is different in that the third matching circuit 36 is made up of the low pass filter type matching circuit 30 having two stages.

Next, an operation of the high frequency amplifier according to Embodiment 2 is described with reference to the drawings. FIGS. 6A-6D are Smith charts illustrating impedance of the output matching circuit of the high frequency amplifier according to Embodiment 2 of the present invention.

A flow of the signal in the high frequency amplifier 100, a method of applying the bias, and the conditions required to the output matching circuit 15 are the same as those in the above-mentioned Embodiment 1, and hence descriptions thereof are omitted.

Figure 6A:
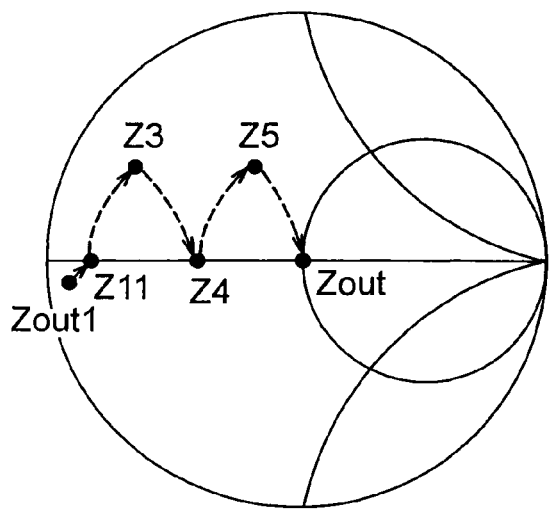
FIGS. 6A-6D are Smith charts illustrating impedance of an output matching circuit of the high frequency amplifier according to Embodiment 2 of the present invention.
Figure 6B:
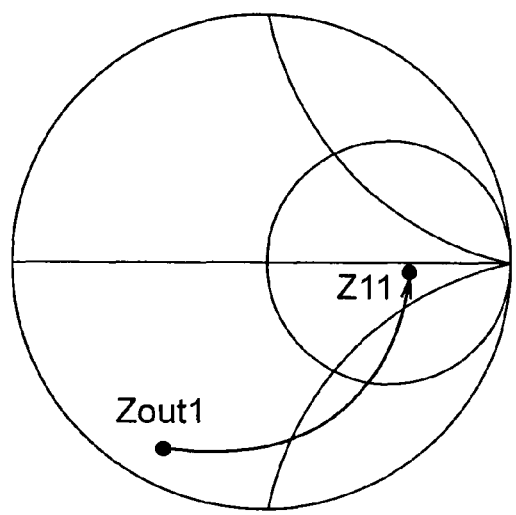
Figure 6C:
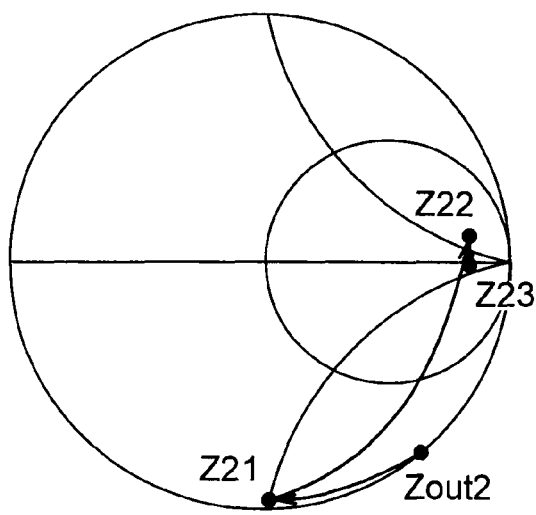
Figure 6D:
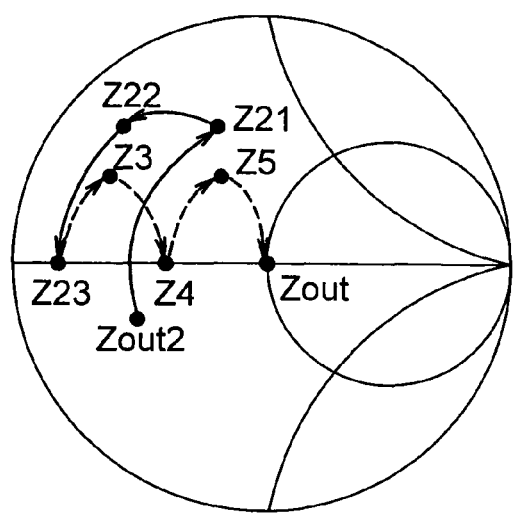

An operation of the output matching circuit 15 of the high frequency amplifier 100 illustrated in FIG. 5 is described. FIGS. 6A and 6B illustrate loci of impedance of the first matching circuit 34 viewed from the connection node 29 in the case where the output power is high and in the case where it is low, respectively, with full line arrows. FIGS. 6C and 6D illustrate loci of impedance of the second matching circuit 35 viewed from the connection node 29 in the case where the output power is high and in the case where it is low, respectively, with full line arrows. In addition, a locus of impedance of the circuit from the connection node 29 to the output terminal 2 is also illustrated with a dotted line arrow. In FIGS. 6A-6D, Zout1, Z11, Zout2, Z21, Z22, Z23, Z3, Z4, Z5, and Zout respectively denote impedances viewed from positions indicated on the circuit diagram of FIG. 5.

FIG. 6A is a diagram illustrating impedance of the first matching circuit 34 viewed from the connection node 29 in the case where the output power is high. FIG. 6B is a diagram illustrating impedance of the first matching circuit 34 viewed from the connection node 29 in the case where the output power is low. FIG. 6C is a diagram illustrating impedance of the second matching circuit 35 viewed from the connection node 29 in the case where the output power is high. FIG. 6D is a diagram illustrating impedance of the second matching circuit 35 viewed from the connection node 29 in the case where the output power is low.

With reference to FIGS. 6A and 6D, it is understood that Z11 that is impedance (first impedance) of the first matching circuit 34 viewed from the connection node 29 in the case where the output power is high is substantially the same as Z23 that is impedance (second impedance) of the second matching circuit 35 viewed from the connection node 29 in the case where the output power is low. Therefore, the above-mentioned "first condition" can be satisfied. Thus, the output impedance Zout of the high frequency amplifier 100 can be matched to 50 ohms ($\Omega$) by the third matching circuit 36 in any case when the amplifying elements 11 and 12 are switched in accordance with a level of the output power. Therefore, the high frequency amplifier 100 can realize characteristics such as high output power and high efficiency in any cases where the output power is high and where it is low.

With reference to FIGS. 6C and 6A, it is understood that Z23 that is impedance (second impedance) of the second matching circuit 35 in the case where the output power is high is sufficiently higher than Z11 that is impedance (first impedance) of the first matching circuit 34 viewed from the connection node 29 in the case where the output power is high. Therefore, the above-mentioned "second condition" can be satisfied. Thus, the loss due to the high frequency signal that passes around to the second matching circuit 35 in the output matching circuit 15 can be reduced, and hence characteristics such as the high output power and high efficiency can be realized in the case where the output power is high. At the same time, the high frequency signal does not pass around to the second matching circuit 35, and hence the oscillation generated by a feedback of the high frequency signal amplified by the high output power last phase amplifying element 11 to the input side via the low output power last phase amplifying element 12 that is turned off can be suppressed in the case where the output power is high. In other words, isolation between the input and the output of the circuit on a side of the low output power last phase amplifying element 12 that is turned off can be enhanced so that the oscillation can be suppressed.

Here, a method of increasing Z23 that is impedance of the second matching circuit 35 in the case where the output power is high is described. The output impedance Zout2 when the low output power last phase amplifying element 12 is turned off is capacitive impedance as illustrated in FIG. 6C, and hence, though the second matching circuit 35 is connected to the serial inductor 25 on the output side of the amplifying element 12, the size thereof should fall on a range in which the impedance is capacitive, which should not be too large. In view of this, the second matching circuit 35 can increase the impedance Z23 viewed from the connection node 29 by using a high pass filter type matching element such as the collector (drain) bias applying inductor 26 or the serial capacitor 17. In this way, it is necessary to dispose the serial inductor 25 and the high pass filter type matching circuit 27 on the connection node 29 side of the second matching circuit 35.

It is understood from FIGS. 6B and 6D that Z11 that is impedance (first impedance) of the first matching circuit 34 viewed from the connection node 29 in the case where the output power is low is sufficiently higher than Z23 that is impedance (second impedance) of the second matching circuit 35 viewed from the connection node 29 in the case where the output power is low. Therefore, the above-mentioned "third condition" can be satisfied. Thus, the loss generated by the high frequency signal passing around to the first matching circuit 34 in the output matching circuit 15 can be reduced, and hence characteristics such as the high output power and high efficiency can be realized in the case where the output power is low. At the same time, the high frequency signal does not pass around to the first matching circuit 34, and hence the oscillation generated by a feedback of the high frequency signal amplified by the low output power last phase amplifying element 12 to the input side via the high output power last phase amplifying element 11 that is turned off can be suppressed in the case where the output power is low. In other words, isolation between the input and the output of the circuit on a side of the high output power last phase amplifying element 11 that is turned off can be enhanced, and hence the oscillation can be suppressed.

Here, a method of increasing Z11 that is impedance of the first matching circuit 34 in the case where the output power is low is described. The output impedance Zout1 when the high output power last phase amplifying element 11 is turned off is capacitive impedance as illustrated in FIG. 6B, and hence the first matching circuit 34 can increase the impedance Z11 viewed from the connection node 29 by providing the high pass filter type matching circuit 27 made up of the short stub. The short stub is made up of the collector (drain) bias line 23 and the bypass capacitor 24. In other words, the first matching circuit 34 includes the high pass filter type matching circuit 27 disposed at the position that is closest to the connection node 29.

In addition, the high frequency amplifier 100 according to Embodiment 2 is different from the high frequency amplifier 100 according to the above-mentioned Embodiment 1 as follows. The matching circuit between the high output power last phase amplifying element 11 that is turned on in the case where the output power is high and the output terminal 2 is made up of the high pass filter type matching circuit that works also as a bias circuit partially and a low pass filter type matching circuit in Embodiment 1. In contrast, all the circuits except the bias circuit are made up of the low pass filter type matching circuit in Embodiment 2.

The high pass filter type matching circuit has a problem that if a parallel inductor is used in a low impedance, a loss due to a parasitic resistance of the inductor becomes large. In the high frequency amplifier 100 according to Embodiment 2, the output matching circuit 15 is made up mainly of the low pass filter type matching circuit, and hence a loss in the output matching circuit 15 in the case where the output power is high is reduced, whereby the high frequency amplifier 100 can have higher output power as well as higher efficiency compared with the high frequency amplifier 100 according to Embodiment 1.

According to Embodiment 2, the high frequency amplifier 100 illustrated in FIG. 5 includes the first matching circuit 34 disposed on the output side of the high output power last phase amplifying element 11, the second matching circuit 35 disposed on the output side of the low output power last phase amplifying element 12 and the third matching circuit 36 disposed on the post stage thereof. Therefore, it can be matched to the characteristic impedance of 50 ohms (Ω) in any cases of high and low output powers, and hence characteristics such as the high output power and high efficiency can be realized as the high frequency amplifier.

In addition, the impedance of the matching circuit on the turned-off amplifying element side viewed from the connection node 29 can be sufficiently higher than the impedance of the matching circuit on the turned-on amplifying element side viewed from the connection node 29 in any cases of high and low output powers. Therefore, it is possible to prevent the amplified high frequency signal from passing around to the matching circuit on the turned-off amplifying element side, and hence a loss in the output matching circuit 15 can be reduced, whereby characteristics such as the high output power and high efficiency can be realized as the high frequency amplifier. Further, isolation between the input and the output on the turned-off amplifying element side can be enhanced, and the oscillation due to the signal passing around the turned-off amplifying element can be suppressed.

Further, in the case where the output power is high, the output matching circuit 15 when the high output power last phase amplifying element 11 is turned on is made up mainly of the low pass filter type matching circuit, and hence a loss in the output matching circuit 15 in the case where the output power is high can be reduced, whereby the high frequency amplifier 100 can have higher output power as well as higher efficiency.

Note that the circuit described in Embodiment 2 is made up mainly of lumped constant elements, but the serial inductor 25 may be made up of a serial line, the parallel capacitor 22 may be made up of an open stub, and the parallel inductor may be made up of a short stub. The amplifying elements 11 and 12 are made up of a heterobipolar transistor (HBT), but may be made up of another bipolar transistor or a field effect transistor (FET) such as a metal-semiconductor FET (MESFET) or a high electron mobility transistor (HEMT). Further, the collector (drain) bias applying inductor 26 may be used instead of the collector (drain) bias line 23, and vice versa. Specifically, the collector (drain) bias line 23 may be used instead of the collector (drain) bias applying inductor 26. In addition, the collector (drain) bias line 23 and the collector (drain) bias applying inductor 26 work also as matching elements.

Embodiment 3

Figure 7:
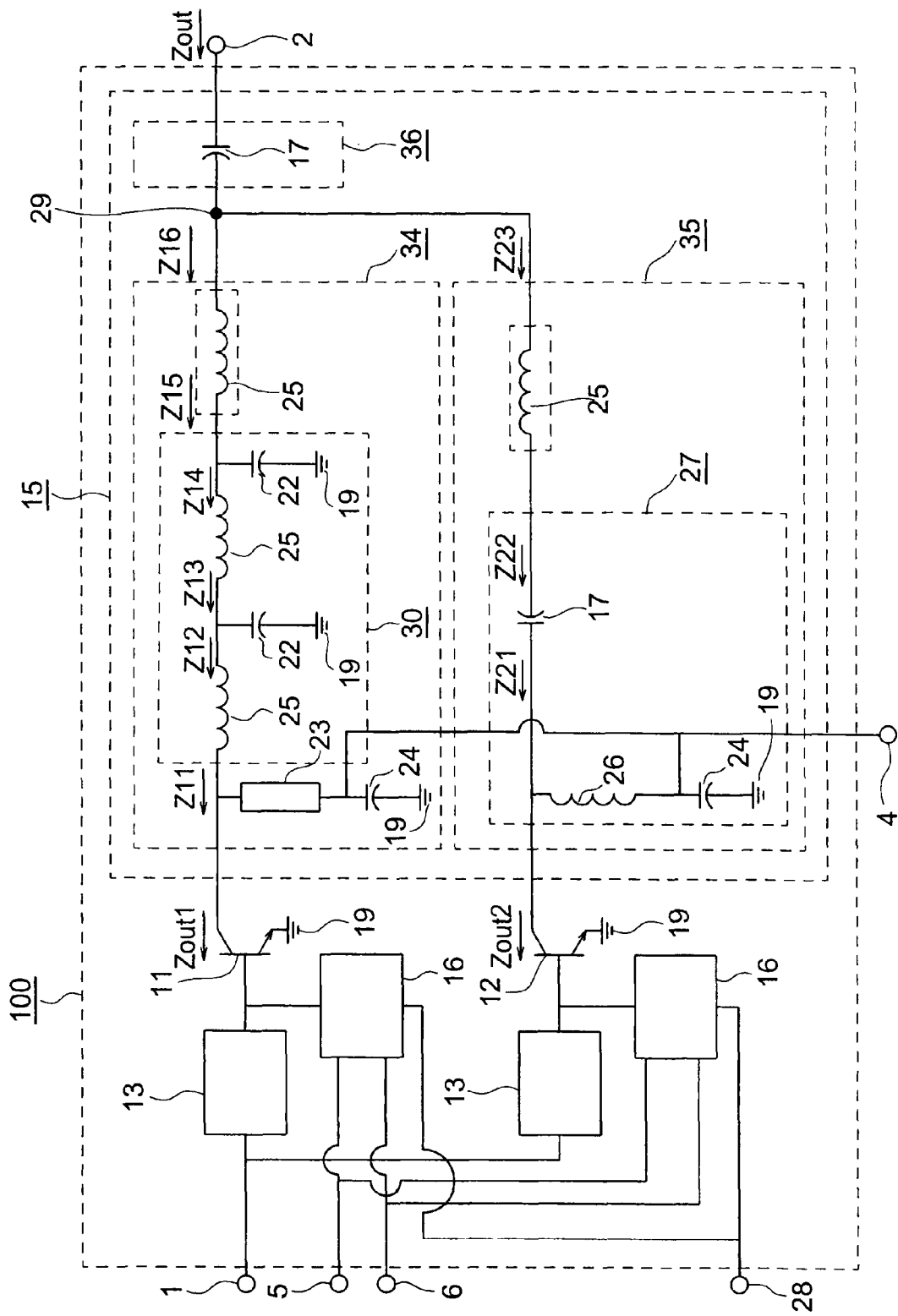
FIG. 7 is a circuit diagram illustrating a structure of a high frequency amplifier according to Embodiment 3 of the present invention.

A high frequency amplifier according to Embodiment 3 of the present invention is described with reference to FIGS. 7 and 8A-8D. FIG. 7 is a circuit diagram illustrating a structure of the high frequency amplifier according to Embodiment 3 of the present invention.

In FIG. 7, a high frequency amplifier 100 according to Embodiment 3 includes an input terminal 1, an output terminal 2, a collector (drain) bias terminal 4, a base (gate) bias setting terminal 5, and a mode switching terminal 6.

In addition, the high frequency amplifier 100 includes a high output power last phase amplifying element (first amplifying element) 11, a low output power last phase amplifying element (second amplifying element) 12, two input matching circuits 13, an output matching circuit 15, and two base (gate) bias control circuits (first and second bias control circuits) 16. An element size of the high output power last phase amplifying element 11 is larger than a size of the low output power last phase amplifying element 12. Note that each of the two base (gate) bias control circuits 16 is connected to a power source terminal 28.

The output matching circuit 15 includes a first matching circuit 34, a second matching circuit 35, and a third matching circuit 36. Note that the first and second matching circuits 34 and 35 are connected to the third matching circuit 36 via a connection node 29.

The first matching circuit 34 includes a short stub made up of a collector (drain) bias line 23 and a bypass capacitor 24, a low pass filter type matching circuit 30, and a serial inductor (first serial inductor) 25. In addition, the low pass filter type matching circuit 30 includes two stages of circuits made up of a serial inductor (third serial inductor) 25 and a parallel capacitor (first parallel capacitor) 22. Note that an end of each of the bypass capacitor 24 and parallel capacitor 22 is connected to a ground 19.

The second matching circuit 35 includes a high pass filter type matching circuit 27 and a serial inductor (second serial inductor) 25. In addition, the high pass filter type matching circuit 27 includes a collector (drain) bias applying inductor 26, the bypass capacitor 24, and a serial capacitor 17. Note that an end of the bypass capacitor 24 is connected to the ground 19.

The third matching circuit 36 includes the serial capacitor 17.

The high frequency amplifier 100 of Embodiment 3 illustrated in FIG. 7 is different from the high frequency amplifier 100 of Embodiment 1 illustrated in FIG. 1 in that the first matching circuit 34 is made up of the short stub including the collector (drain) bias line 23 and the bypass capacitor 24, the low pass filter type matching circuit 30 including two stages of circuits including the serial inductor 25 and the parallel capacitor 22, and the serial inductor 25.

In addition, it is different in that the second matching circuit 35 is made up of the circuit including the collector (drain) bias applying inductor 26 and the bypass capacitor 24, the high pass filter type matching circuit 27 including the serial capacitor 17, and the serial inductor 25.

Further, it is different in that the third matching circuit 36 is made up of only the serial capacitor 17. However, the third matching circuit 36 is made up of only the serial capacitor 17 in FIG. 7, but it may have any circuit structure as long as it is a matching circuit that can match the medium impedance to 50 ohms (Ω). The third matching circuit 36 may be made up of a circuit including a serial capacitor and a serial inductor. In addition, similarly to the above-mentioned Embodiment 1, it may be made up of a single stage of the low pass filter type matching circuit 30, a multistage low pass filter type matching circuit, a single stage or multistage high pass filter type matching circuit, or a matching circuit that is a combination of the low pass filter type matching circuit and the high pass filter type matching circuit.

Next, an operation of the high frequency amplifier according to Embodiment 3 is described with reference to the drawings. FIGS. 8A-8D are Smith charts illustrating impedance of the output matching circuit of the high frequency amplifier according to Embodiment 3 of the present invention.

A flow of the signal in the high frequency amplifier 100, a method of applying the bias, and the conditions required to the output matching circuit 15 are the same as those in the above-mentioned embodiments, and hence descriptions thereof are omitted.

Figure 8A:
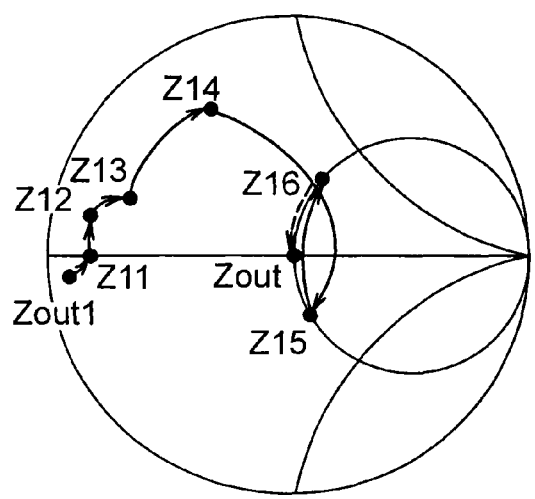
FIGS. 8A-8D are Smith charts illustrating impedance of an output matching circuit of the high frequency amplifier according to Embodiment 3 of the present invention.
Figure 8B:
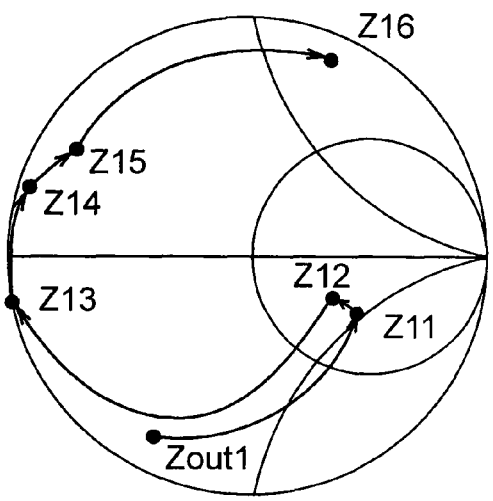
Figure 8C:
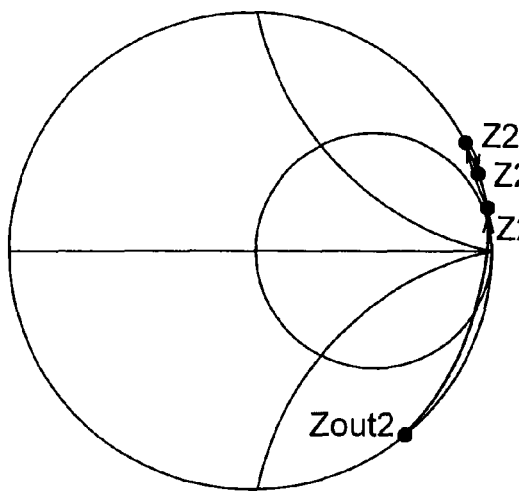
Figure 8D:
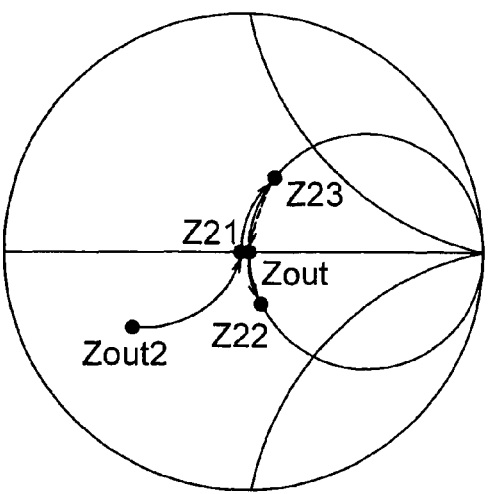

An operation of the output matching circuit 15 of the high frequency amplifier 100 illustrated in FIG. 7 is described. FIGS. 8A and 8B illustrate loci of impedance of the first matching circuit 34 viewed from the connection node 29 in the case where the output power is high and in the case where it is low, respectively, with full line arrows. FIGS. 8C and 8D illustrate loci of impedance of the second matching circuit 35 viewed from the connection node 29 in the case where the output power is high and in the case where it is low, respectively, with full line arrows. In addition, a locus of impedance of the circuit from the connection node 29 to the output terminal 2 is also illustrated with a dotted line arrow. In FIGS. 8A-8D, Zout1, Z11, Z12, Z13, Z14, Z15, Z16, Zout2, Z21, Z22, Z23 and Zout respectively denote impedances viewed from positions indicated on the circuit diagram of FIG. 7.

FIG. 8A is a diagram illustrating impedance of the first matching circuit 34 viewed from the connection node 29 in the case where the output power is high. FIG. 8B is a diagram illustrating impedance of the first matching circuit 34 viewed from the connection node 29 in the case where the output power is low. FIG. 8C is a diagram illustrating impedance of the second matching circuit 35 viewed from the connection node 29 in the case where the output power is high. FIG. 8D is a diagram illustrating impedance of the second matching circuit 35 viewed from the connection node 29 in the case where the output power is low.

With reference to FIGS. 8A and 8D, it is understood that Z16 that is impedance (first impedance) of the first matching circuit 34 viewed from the connection node 29 in the case where the output power is high is substantially the same as Z23 that is impedance (second impedance) of the second matching circuit 35 viewed from the connection node 29 in the case where the output power is low. Therefore, the above-mentioned "first condition" can be satisfied. Thus, the output impedance Zout of the high frequency amplifier 100 can be matched to 50 ohms (Ω) by the third matching circuit 36 in any case when the amplifying elements 11 and 12 are switched in accordance with a level of the output power. Therefore, the high frequency amplifier 100 can realize characteristics such as high output power and high efficiency in any cases where the output power is high and where it is low. In addition, the impedances Z16 and Z23 are matched to substantially 50 ohms (Ω), and hence a simple circuit structure made up of only the serial capacitor 17 is sufficient for matching to 50 ohms (Ω).

With reference to FIGS. 8C and 8A, it is understood that Z23 that is impedance (second impedance) of the second matching circuit 35 viewed from the connection node 29 in the case where the output power is high is sufficiently higher than Z16 that is impedance (first impedance) of the first matching circuit 34 viewed from the connection node 29 in the case where the output power is high. Therefore, the above-mentioned "second condition" can be satisfied. Thus, the loss due to the high frequency signal that passes around to the second matching circuit 35 in the output matching circuit 15 can be reduced, and hence characteristics such as the high output power and high efficiency can be realized in the case where the output power is high. At the same time, the high frequency signal does not pass around to the second matching circuit 35, and hence the oscillation generated by a feedback of the high frequency signal amplified by the high output power last phase amplifying element 11 to the input side via the low output power last phase amplifying element 12 that is turned off can be suppressed in the case where the output power is high. In other words, isolation between the input and the output of the circuit on a side of the low output power last phase amplifying element 12 that is turned off can be enhanced so that the oscillation can be suppressed.

Here, a method of increasing Z23 that is impedance of the second matching circuit 35 viewed from the connection node 29 in the case where the output power is high is described. The output impedance Zout2 when the low output power last phase amplifying element 12 is turned off is capacitive impedance as illustrated in FIG. 8C, and hence the second matching circuit 35 can increase the impedance Z23 viewed from the connection node 29 by using a high pass filter type matching element such as the collector (drain) bias applying inductor 26 or the serial capacitor 17. In view of this, the second matching circuit 35 includes the serial inductor 25 at a position that is closest to the connection node 29 from the fact that the impedance Z22 is capacitive impedance. In this way, it is necessary to dispose the high pass filter type matching circuit 27 and the serial inductor 25 on the connection node 29 side of the second matching circuit 35.

It is understood from FIGS. 8B and 8D that Z16 that is impedance (first impedance) of the first matching circuit 34 viewed from the connection node 29 in the case where the output power is low is sufficiently higher than Z23 that is impedance (second impedance) of the second matching circuit 35 viewed from the connection node 29 in the case where the output power is low. Therefore, the above-mentioned "third condition" can be satisfied. Thus, the loss generated by the high frequency signal passing around to the first matching circuit 34 in the output matching circuit 15 can be reduced, and hence characteristics such as the high output power and high efficiency can be realized in the case where the output power is low. At the same time, the high frequency signal does not pass around to the first matching circuit 34, and hence the oscillation generated by a feedback of the high frequency signal amplified by the low output power last phase amplifying element 12 to the input side via the high output power last phase amplifying element 11 that is turned off can be suppressed in the case where the output power is low. In other words, isolation between the input and the output of the circuit on a side of the high output power last phase amplifying element 11 that is turned off can be enhanced, and hence the oscillation can be suppressed.

Here, a method of increasing the impedance Z16 of the first matching circuit 34 viewed from the connection node 29 in the case where the output power is low is described. The output impedance Zout1 when the high output power last phase amplifying element 11 is turned off is capacitive impedance as illustrated in FIG. 8B, and hence the first matching circuit 34 can increase the impedance Z11 viewed from the connection node 29 by providing a short stub. This short stub is made up of the collector (drain) bias line 23 and the bypass capacitor 24. However, for a purpose of matching when the high output power last phase amplifying element 11 is turned on, the first matching circuit 34 includes the low pass filter type matching circuit 30. Therefore, the impedance is decreased (Z12→Z13→Z14→Z15). In this case, the impedance Z15 is inductive impedance, and hence it is necessary to insert the serial inductor 25 at the position that is the closest to the connection node 29 so as to increase the impedance (Z16). In this way, it is necessary to dispose the serial inductor 25 on the connection node 29 side in the first matching circuit 34.

In addition, the high frequency amplifier 100 according to Embodiment 3 is different from the high frequency amplifier 100 according to the above-mentioned Embodiment 1 as follows. The matching circuit between the high output power last phase amplifying element 11 that is turned on in the case where the output power is high and the output terminal 2 is made up of the high pass filter type matching circuit that works also as a bias circuit partially and a low pass filter type matching circuit in Embodiment 1. In contrast, the circuit except the bias circuit is made up mainly of the low pass filter type matching circuit in Embodiment 3.

The high pass filter type matching circuit has a problem that if a parallel inductor is used in a low impedance, a loss due to a parasitic resistance of the inductor becomes large. In the high frequency amplifier 100 according to Embodiment 3, the output matching circuit 15 is made up mainly of the low pass filter type matching circuit, and hence a loss in the output matching circuit 15 in the case where the output power is high is reduced, whereby the high frequency amplifier 100 can have higher output power as well as higher efficiency compared with the high frequency amplifier 100 according to Embodiment 1.

According to Embodiment 3, the high frequency amplifier 100 illustrated in FIG. 7 includes the first matching circuit 34 disposed on the output side of the high output power last phase amplifying element 11, the second matching circuit 35 disposed on the output side of the low output power last phase amplifying element 12 and the third matching circuit 36 disposed on the post stage thereof. Therefore, it can be matched to the characteristic impedance of 50 ohms ($\Omega$) in any cases of high and low output powers, and hence characteristics such as the high output power and high efficiency can be realized as the high frequency amplifier.

In addition, the impedance of the matching circuit on the turned-off amplifying element side viewed from the connection node 29 can be sufficiently higher than the impedance of the matching circuit on the turned-on amplifying element side viewed from the connection node 29 in any cases of high and low output powers. Therefore, it is possible to prevent the amplified high frequency signal from passing around to the matching circuit on the turned-off amplifying element side, and hence a loss in the output matching circuit 15 can be reduced, whereby characteristics such as the high output power and high efficiency can be realized as the high frequency amplifier. Further, isolation between the input and the output on the turned-off amplifying element side can be enhanced, and the oscillation due to the signal passing around the turned-off amplifying element can be suppressed.

Further, in the case where the output power is high, the output matching circuit 15 when the high output power last phase amplifying element 11 is turned on is made up mainly of the low pass filter type matching circuit, and hence a loss in the output matching circuit 15 in the case where the output power is high can be reduced, whereby the high frequency amplifier 100 can have higher output power as well as higher efficiency.

Note that the circuit described in Embodiment 3 is made up mainly of lumped constant elements, but the serial inductor 25 may be made up of a serial line, the parallel capacitor 22 may be made up of an open stub, and the parallel inductor may be made up of a short stub. The amplifying elements 11 and 12 are made up of a heterobipolar transistor (HBT), but may be made up of another bipolar transistor or a field effect transistor (FET) such as a metal-semiconductor FET (MESFET) or a high electron mobility transistor (HEMT). Further, the collector (drain) bias applying inductor 26 may be used instead of the collector (drain) bias line 23, and vice versa. Specifically, the collector (drain) bias line 23 may be used instead of the collector (drain) bias applying inductor 26. In addition, the collector (drain) bias line 23 and the collector (drain) bias applying inductor 26 work also as matching elements.

Embodiment 4

Figure 9:
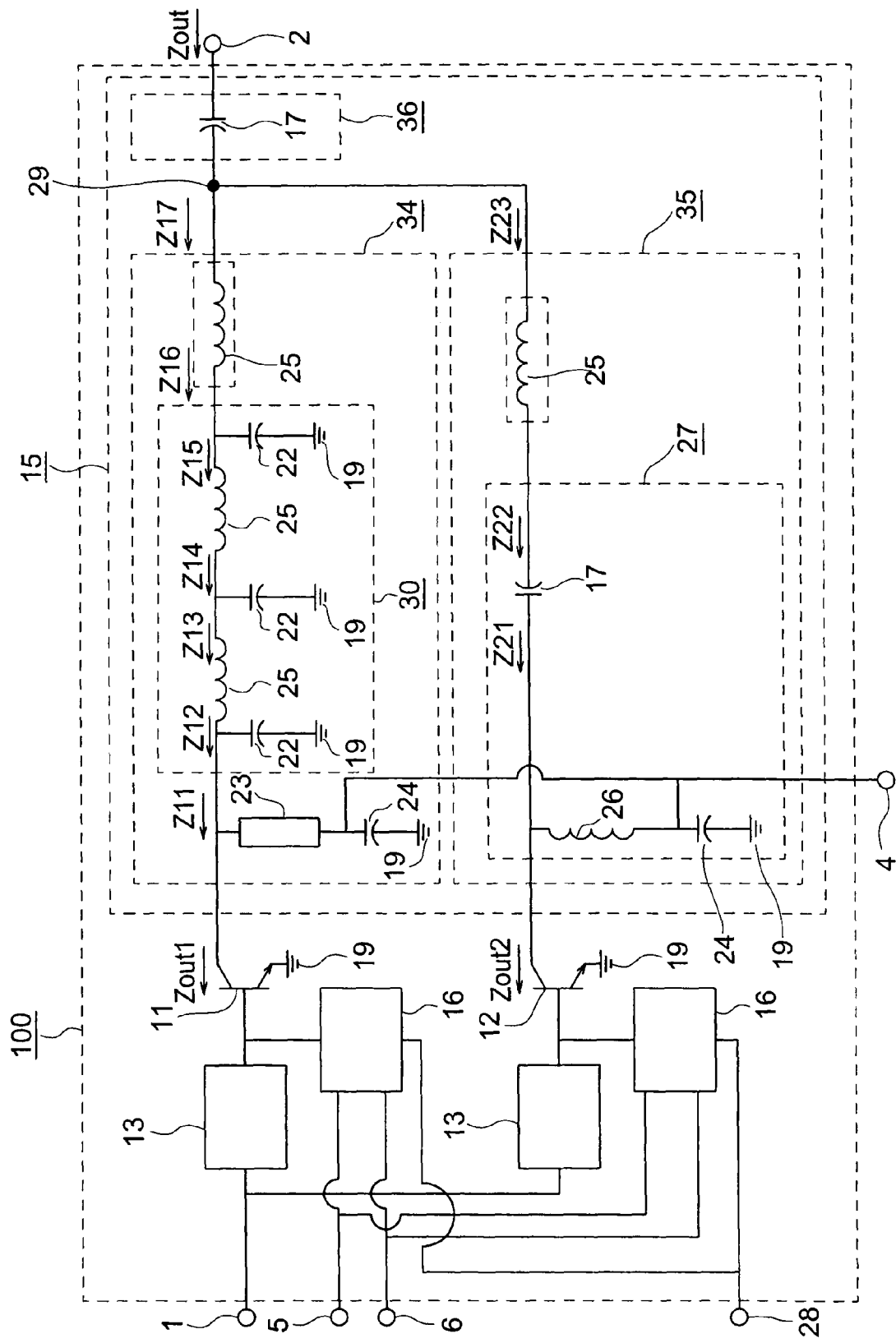
FIG. 9 is a circuit diagram illustrating a structure of a high frequency amplifier according to Embodiment 4 of the present invention.

A high frequency amplifier according to Embodiment 4 of the present invention is described with reference to FIGS. 9 and 10A-10D. FIG. 9 is a circuit diagram illustrating a structure of the high frequency amplifier according to Embodiment 4 of the present invention.

In FIG. 9, a high frequency amplifier 100 according to Embodiment 4 includes an input terminal 1, an output terminal 2, a collector (drain) bias terminal 4, a base (gate) bias setting terminal 5, and a mode switching terminal 6.

In addition, the high frequency amplifier 100 includes a high output power last phase amplifying element (first amplifying element) 11, a low output power last phase amplifying element (second amplifying element) 12, two input matching circuits 13, an output matching circuit 15, and two base (gate) bias control circuits (first and second bias control circuits) 16. An element size of the high output power last phase amplifying element 11 is larger than a size of the low output power last phase amplifying element 12. Note that each of the two base (gate) bias control circuits 16 is connected to a power source terminal 28.

The output matching circuit 15 includes a first matching circuit 34, a second matching circuit 35, and a third matching circuit 36. Note that the first and second matching circuits 34 and 35 are connected to the third matching circuit 36 via a connection node 29.

The first matching circuit 34 includes a short stub made up of a collector (drain) bias line 23 and a bypass capacitor 24, a low pass filter type matching circuit 30 and a serial inductor (first serial inductor) 25. In addition, the low pass filter type matching circuit 30 includes two stages of circuits made up of a parallel capacitor (second parallel capacitor) 22, a serial inductor (third serial inductor) 25, and a parallel capacitor (first parallel capacitor) 22. Note that an end of each of the bypass capacitor 24 and the parallel capacitor 22 is connected to a ground 19.

The second matching circuit 35 includes a high pass filter type matching circuit 27 and a serial inductor (second serial inductor) 25. In addition, the high pass filter type matching circuit 27 includes a collector (drain) bias applying inductor 26, the bypass capacitor 24, and a serial capacitor 17. Note that an end of the bypass capacitor 24 is connected to the ground 19.

The third matching circuit 36 includes the serial capacitor 17.

The high frequency amplifier 100 of Embodiment 4 illustrated in FIG. 9 is different from the high frequency amplifier 100 of Embodiment 3 illustrated in FIG. 7 only in that the parallel capacitor 22 is added to the position that is the closest to the amplifying element 11 in the low pass filter type matching circuit 30 of the first matching circuit 34.

Next, an operation of the high frequency amplifier according to Embodiment 4 is described with reference to the drawings. FIGS. 10A-10D are Smith charts illustrating impedance of the output matching circuit of the high frequency amplifier according to Embodiment 4 of the present invention.

A flow of the signal in the high frequency amplifier 100, a method of applying the bias, and the conditions required to the output matching circuit 15 are the same as those in the above-mentioned embodiments, and hence descriptions thereof are omitted.

Figure 10A:
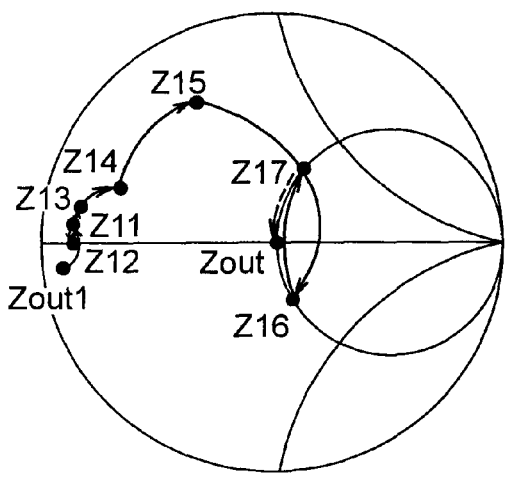
FIGS. 10A-10D are Smith charts illustrating impedance of an output matching circuit of the high frequency amplifier according to Embodiment 4 of the present invention.
Figure 10B:
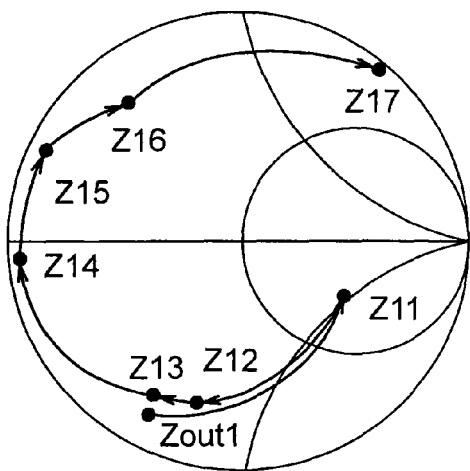
Figure 10C:
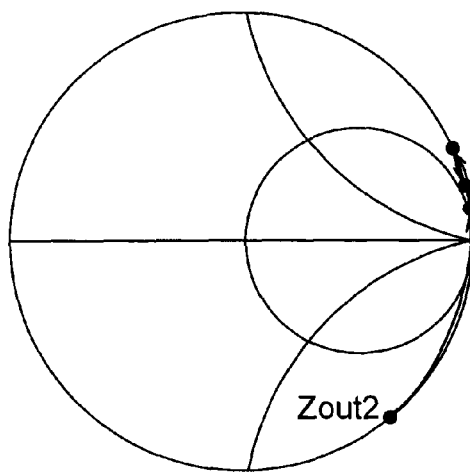
Figure 10D:
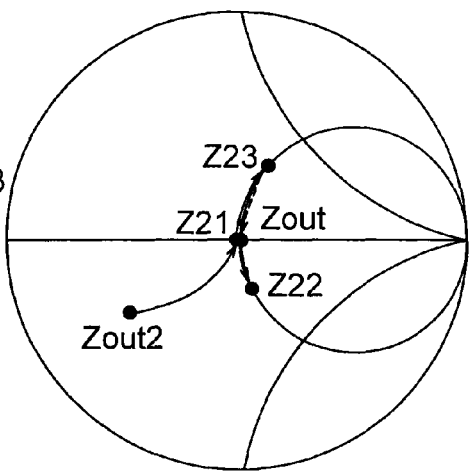

An operation of the output matching circuit 15 of the high frequency amplifier 100 illustrated in FIG. 9 is described. FIGS. 10A and 10B illustrate loci of impedance of the first matching circuit 34 viewed from the connection node 29 in the case where the output power is high and in the case where it is low, respectively, with full line arrows. FIGS. 10C and 10D illustrate loci of impedance of the second matching circuit 35 viewed from the connection node 29 in the case where the output power is high and in the case where it is low, respectively, with full line arrows. In addition, a locus of impedance of the circuit from the connection node 29 to the output terminal 2 is also illustrated with a dotted line arrow. In FIGS. 10A-10D, Zout1, Z11, Z12, Z13, Z14, Z15, Z16, Z17, Zout2, Z21, Z22, Z23 and Zout respectively denote impedances viewed from positions indicated on the circuit diagram of FIG. 9.

FIG. 10A is a diagram illustrating impedance of the first matching circuit 34 viewed from the connection node 29 in the case where the output power is high. FIG. 10B is a diagram illustrating impedance of the first matching circuit 34 viewed from the connection node 29 in the case where the output power is low. FIG. 10C is a diagram illustrating impedance of the second matching circuit 35 viewed from the connection node 29 in the case where the output power is high. FIG. 10D is a diagram illustrating impedance of the second matching circuit 35 viewed from the connection node 29 in the case where the output power is low.

With reference to FIGS. 10A and 10D, it is understood that Z17 that is impedance (first impedance) of the first matching circuit 34 viewed from the connection node 29 in the case where the output power is high is substantially the same as Z23 that is impedance (second impedance) of the second matching circuit 35 viewed from the connection node 29 in the case where the output power is low. In addition, the impedances Z17 and Z23 are matched to substantially 50 ohms ($\Omega$). The locus of the impedance of the parallel capacitor 22 that is newly added to the position closest to the high output power last phase amplifying element 11 in the low pass filter type matching circuit 30 is small from Z11 to Z12 because the impedance value is small. Therefore, it is understood that the newly added parallel capacitor 22 does not cause a problem for the matching. Therefore, the above-mentioned "first condition" can be satisfied. Thus, the output impedance Zout of the high frequency amplifier 100 can be matched to 50 ohms ($\Omega$) by the third matching circuit 36 in any case when the amplifying elements 11 and 12 are switched in accordance with a level of the output power. Therefore, the high frequency amplifier 100 can realize characteristics such as high output power and high efficiency in any cases where the output power is high and where it is low.

With reference to FIGS. 10C and 10A, it is understood that Z23 that is impedance (second impedance) of the second matching circuit 35 in the case where the output power is high is sufficiently higher than Z17 that is impedance (first impedance) of the first matching circuit 34 viewed from the connection node 29 in the case where the output power is high. Therefore, the above-mentioned "second condition" can be satisfied. Thus, the loss due to the high frequency signal that passes around to the second matching circuit 35 in the output matching circuit 15 can be reduced, and hence characteristics such as the high output power and high efficiency can be realized in the case where the output power is high. At the same time, the high frequency signal does not pass around to the second matching circuit 35, and hence the oscillation generated by a feedback of the high frequency signal amplified by the high output power last phase amplifying element 11 to the input side via the low output power last phase amplifying element 12 that is turned off can be suppressed in the case where the output power is high. In other words, isolation between the input and the output of the circuit on a side of the low output power last phase amplifying element 12 that is turned off can be enhanced so that the oscillation can be suppressed.

Here, a method of increasing Z23 that is impedance of the second matching circuit 35 viewed from the connection node 29 in the case where the output power is high is described. The output impedance Zout2 when the low output power last phase amplifying element 12 is turned off is capacitive impedance as illustrated in FIG. 10C, and hence the second matching circuit 35 can increase the impedance viewed from the connection node 29 by using a high pass filter type matching element such as the collector (drain) bias applying inductor 26 or the serial capacitor 17. In view of this, the serial inductor 25 is provided at a position that is closest to the connection node 29 from the fact that the impedance Z22 is capacitive. In this way, it is necessary to dispose the high pass filter type matching circuit 27 and the serial inductor 25 on the connection node 29 side of the second matching circuit 35.

It is understood from FIGS. 10B and 10D that Z17 that is impedance (first impedance) of the first matching circuit 34 viewed from the connection node 29 in the case where the output power is low is sufficiently higher than Z23 that is impedance (second impedance) of the second matching circuit 35 viewed from the connection node 29 in the case where the output power is low. The newly added parallel capacitor 22 is inserted at the position that is closest to the high output power last phase amplifying element 11 in the low pass filter type matching circuit 30, and hence the impedance Z17 of the first matching circuit 34 viewed from the connection node 29 can be increased compared with the case where it is not inserted as illustrated in FIG. 8B. Therefore, the above-mentioned "third condition" can be satisfied. Thus, the loss generated by the high frequency signal passing around to the first matching circuit 34 in the output matching circuit 15 can be reduced, and hence characteristics such as the high output power and high efficiency can be realized in the case where the output power is low. At the same time, the high frequency signal does not pass around to the first matching circuit 34, and hence the oscillation generated by a feedback of the high frequency signal amplified by the low output power last phase amplifying element 12 to the input side via the high output power last phase amplifying element 11 that is turned off can be suppressed in the case where the output power is low. In other words, isolation between the input and the output of the circuit on a side of the high output power last phase amplifying element 11 that is turned off can be enhanced, and hence the oscillation can be suppressed.

Here, a method of increasing the impedance Z17 of the first matching circuit 34 viewed from the connection node 29 in the case where the output power is low is described. The output impedance Zout1 when the high output power last phase amplifying element 11 is turned off is capacitive impedance as illustrated in FIG. 10B, and hence the first matching circuit 34 can increase the impedance by providing a short stub. This short stub is made up of the collector (drain) bias line 23 and the bypass capacitor 24. However, for a purpose of matching when the high output power last phase amplifying element 11 is turned on, the low pass filter type matching circuit 30 is provided. Therefore, the impedance is decreased. In this case, the impedance (Z16) is inductive, and hence it is necessary to insert the serial inductor 25 at the position that is the closest to the connection node 29 so as to increase the impedance.

In addition, comparing the high frequency amplifier 100 according to Embodiment 4 with the high frequency amplifier 100 according to the above-mentioned Embodiment 3, the impedance Z17 of the first matching circuit 34 viewed from the connection node 29 can be increased more by newly inserting the parallel capacitor 22 at the position that is closest to the amplifying element 11 in the low pass filter type matching circuit 30 in the case where the output power is low, as described above. Therefore, a loss generated by the high frequency signal passing around to the first matching circuit 34 in the output matching circuit 15 can be further reduced in the case where the output power is low, and hence the output power and the efficiency can be further enhanced in the case where the output power is low. At the same time, the high frequency signal does not pass around to the first matching circuit 34, and hence the oscillation generated by a feedback of the high frequency signal amplified by the low output power last phase amplifying element 12 to the input side via the high output power last phase amplifying element 11 that is turned off can be further suppressed in the case where the output power is low. In other words, the isolation between the input and the output of the circuit on the side of the high output power last phase amplifying element 11 that is turned off can be further enhanced, and hence the oscillation can be further suppressed.

According to Embodiment 4, the high frequency amplifier 100 illustrated in FIG. 9 includes the first matching circuit 34 disposed on the output side of the high output power last phase amplifying element 11, the second matching circuit 35 disposed on the output side of the low output power last phase amplifying element 12 and the third matching circuit 36 disposed on the post stage thereof. Therefore, it can be matched to the characteristic impedance of 50 ohms (Ω) in any cases of high and low output powers, and hence characteristics such as the high output power and high efficiency can be realized as the high frequency amplifier.

In addition, the impedance of the matching circuit on the turned-off amplifying element side viewed from the connection node 29 can be sufficiently higher than the impedance of the matching circuit on the turned-on amplifying element side viewed from the connection node 29 in any cases of high and low output powers. Therefore, it is possible to prevent the amplified high frequency signal from passing around to the matching circuit on the turned-off amplifying element side, and hence a loss in the output matching circuit 15 can be reduced, whereby characteristics such as the high output power and high efficiency can be realized as the high frequency amplifier. Further, isolation between the input and the output on the turned-off amplifying element side can be enhanced, and the oscillation due to the signal passing around the turned-off amplifying element can be suppressed.

Further, in the case where the output power is high, the output matching circuit 15 when the high output power last phase amplifying element 11 is turned on is made up mainly of the low pass filter type matching circuit, and hence a loss in the output matching circuit 15 in the case where the output power is high can be reduced, whereby the high frequency amplifier 100 can have higher output power as well as higher efficiency.

Further, the impedance Z17 of the first matching circuit 34 viewed from the connection node 29 can be further increased in the case where the output power is low. The loss generated by the high frequency signal passing around to the first matching circuit 34 can be further reduced in the output matching circuit 15, and hence the output power and the efficiency can be further enhanced in the case where the output power is low. In addition, the isolation between the input and the output of the circuit on the side of the high output power last phase amplifying element 11 that is turned off can be further enhanced, and hence the oscillation can be further suppressed.

Note that the circuit described in Embodiment 4 is made up mainly of lumped constant elements, but the serial inductor 25 may be made up of a serial line, the parallel capacitor 22 may be made up of an open stub, and the parallel inductor may be made up of a short stub. The amplifying elements 11 and 12 are made up of a heterobipolar transistor (HBT), but may be made up of another bipolar transistor or a field effect transistor (FET) such as a metal-semiconductor FET (MESFET) or a high electron mobility transistor (HEMT). Further, the collector (drain) bias applying inductor 26 may be used instead of the collector (drain) bias line 23, and vice versa. Specifically, the collector (drain) bias line 23 may be used instead of the collector (drain) bias applying inductor 26. In addition, the collector (drain) bias line 23 and the collector (drain) bias applying inductor 26 work also as matching elements.

Embodiment 5

Figure 11:
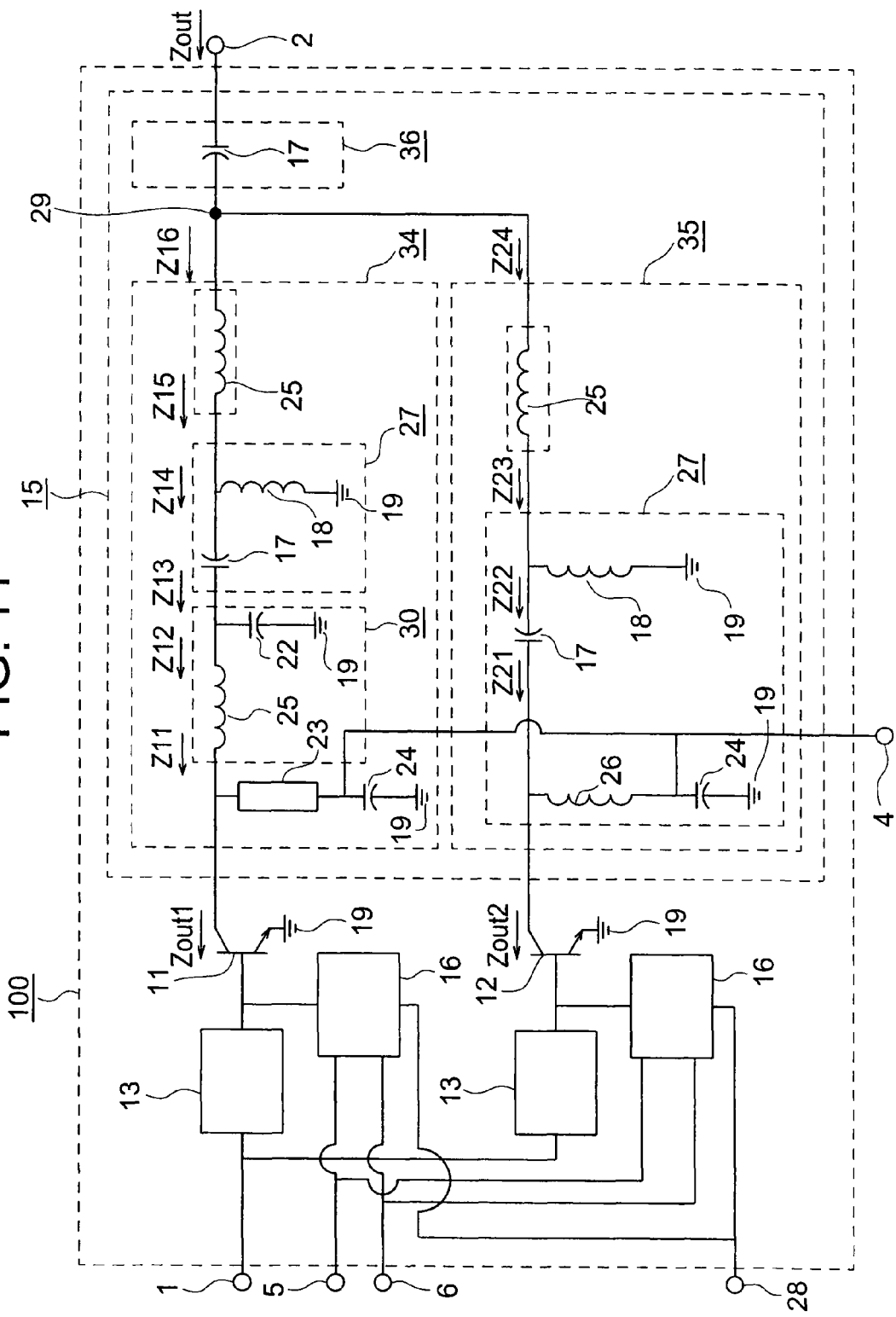
FIG. 11 is a circuit diagram illustrating a structure of a high frequency amplifier according to Embodiment 5 of the present invention.

A high frequency amplifier according to Embodiment 5 of the present invention is described with reference to FIGS. 11 and 12A-12D. FIG. 11 is a circuit diagram illustrating a structure of the high frequency amplifier according to Embodiment 5 of the present invention.

In FIG. 11, a high frequency amplifier 100 according to Embodiment 5 includes an input terminal 1, an output terminal 2, a collector (drain) bias terminal 4, a base (gate) bias setting terminal 5, and a mode switching terminal 6.

In addition, the high frequency amplifier 100 includes a high output power last phase amplifying element (first amplifying element) 11, a low output power last phase amplifying element (second amplifying element) 12, two input matching circuits 13, an output matching circuit 15, and two base (gate) bias control circuits (first and second bias control circuits) 16. An element size of the high output power last phase amplifying element 11 is larger than a size of the low output power last phase amplifying element 12. Note that each of the two base (gate) bias control circuits 16 is connected to a power source terminal 28.

The output matching circuit 15 includes a first matching circuit 34, a second matching circuit 35, and a third matching circuit 36. Note that the first and second matching circuits 34 and 35 are connected to the third matching circuit 36 via a connection node 29.

The first matching circuit 34 includes a short stub including a collector (drain) bias line 23 and a bypass capacitor 24, a low pass filter type matching circuit 30, a high pass filter type matching circuit (first high pass filter type matching circuit) 27, and a serial inductor (first serial inductor) 25. In addition, the low pass filter type matching circuit 30 includes the serial inductor 25 and a parallel capacitor 22. The high pass filter type matching circuit 27 includes a serial capacitor 17 and a parallel inductor 18. Note that an end of each of the bypass capacitor 24, the parallel capacitor 22 and the parallel inductor 18 is connected to a ground 19.

The second matching circuit 35 includes a high pass filter type matching circuit (second high pass filter type matching circuit) 27 and a serial inductor (second serial inductor) 25. In addition, the high pass filter type matching circuit 27 includes a collector (drain) bias applying inductor 26, the bypass capacitor 24, the serial capacitor 17, and the parallel inductor 18. Note that an end of each of the bypass capacitor 24 and the parallel inductor 18 is connected to the ground 19.

The third matching circuit 36 includes the serial capacitor 17.

The high frequency amplifier 100 of Embodiment 5 illustrated in FIG. 11 is different from the high frequency amplifier 100 of Embodiment 3 illustrated in FIG. 7 only in that the first matching circuit 34 is made up of the short stub including the collector (drain) bias line 23 and the bypass capacitor 24, the low pass filter type matching circuit 30 including the serial inductor 25 and the parallel capacitor 22, the high pass filter type matching circuit 27 including the serial capacitor 17 and the parallel inductor 18, and the serial inductor 25.

Next, an operation of the high frequency amplifier according to Embodiment 5 is described with reference to the drawings. FIGS. 12A-12D are Smith charts illustrating impedance of the output matching circuit of the high frequency amplifier according to Embodiment 5 of the present invention.

A flow of the signal in the high frequency amplifier 100, a method of applying the bias, and the conditions required to the output matching circuit 15 are the same as those in the above-mentioned embodiments, and hence descriptions thereof are omitted.

Figure 12A:
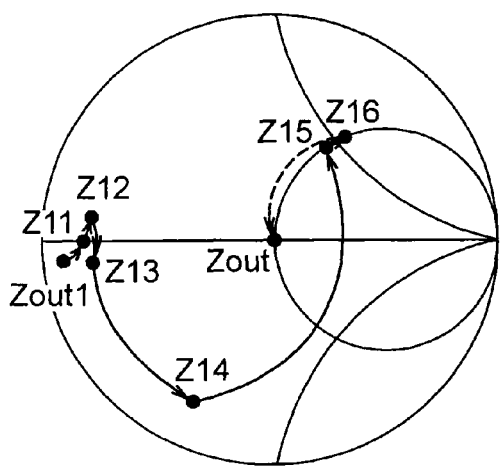
FIGS. 12A-12D are Smith charts illustrating impedance of an output matching circuit of the high frequency amplifier according to Embodiment 5 of the present invention.
Figure 12B:
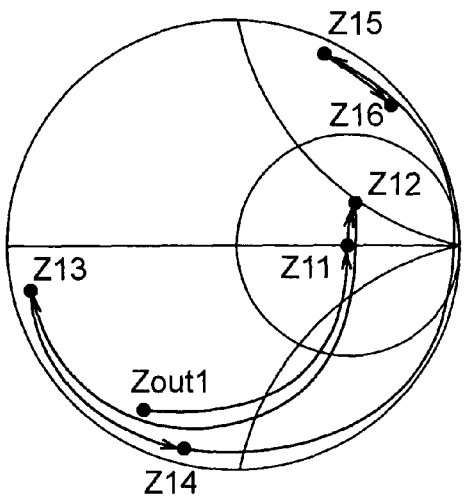
Figure 12C:
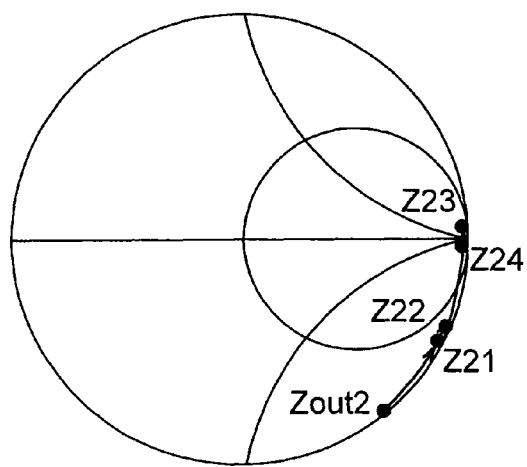
Figure 12D:
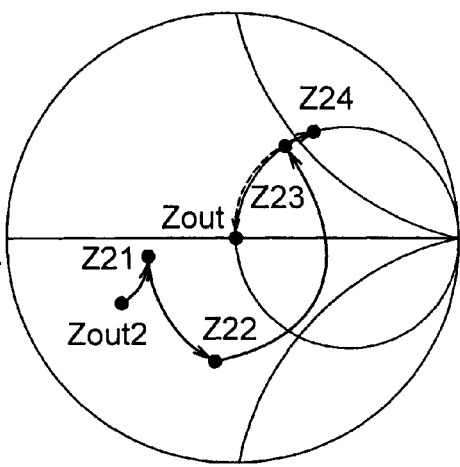

An operation of the output matching circuit 15 of the high frequency amplifier 100 illustrated in FIG. 11 is described. FIGS. 12A and 12B illustrate loci of impedance of the first matching circuit 34 viewed from the connection node 29 in the case where the output power is high and in the case where it is low, respectively, with full line arrows. FIGS. 12C and 12D illustrate loci of impedance of the second matching circuit 35 viewed from the connection node 29 in the case where the output power is high and in the case where it is low, respectively, with full line arrows. In addition, a locus of impedance of the circuit from the connection node 29 to the output terminal 2 is also illustrated with a dotted line arrow. In FIGS. 12A-12D, Zout1, Z11, Z12, Z13, Z14, Z15, Z16, Zout2, Z21, Z22, Z23, Z24, and Zout respectively denote impedances viewed from positions indicated on the circuit diagram of FIG. 11.

FIG. 12A is a diagram illustrating impedance of the first matching circuit 34 viewed from the connection node 29 in the case where the output power is high. FIG. 12B is a diagram illustrating impedance of the first matching circuit 34 viewed from the connection node 29 in the case where the output power is low. FIG. 12C is a diagram illustrating impedance of the second matching circuit 35 viewed from the connection node 29 in the case where the output power is high. FIG. 12D is a diagram illustrating impedance of the second matching circuit 35 viewed from the connection node 29 in the case where the output power is low.

With reference to FIGS. 12A and 12D, the structure of the first matching circuit 34 of Embodiment 5 is difference from that of the first matching circuit 34 of Embodiment 3. However, it is understood that Z16 that is impedance (first impedance) of the first matching circuit 34 viewed from the connection node 29 in the case where the output power is high is substantially the same as Z24 that is impedance (second impedance) of the second matching circuit 35 viewed from the connection node 29 in the case where the output power is low. Therefore, the above-mentioned "first condition" can be satisfied. Thus, the output impedance Zout of the high frequency amplifier 100 can be matched to 50 ohms (Ω) by the third matching circuit 36 in any case when the amplifying elements 11 and 12 are switched in accordance with a level of the output power. Therefore, the high frequency amplifier 100 can realize characteristics such as high output power and high efficiency in any cases where the output power is high and where it is low.

With reference to FIGS. 12C and 12A, the structure of the first matching circuit 34 of Embodiment 5 is difference from that of the first matching circuit 34 of Embodiment 3. However, it is understood that Z24 that is impedance (second impedance) of the second matching circuit 35 viewed from the connection node 29 in the case where the output power is high is sufficiently higher than Z16 that is impedance (first impedance) of the first matching circuit 34 viewed from the connection node 29 in the case where the output power is high. Therefore, the above-mentioned "second condition" can be satisfied. Thus, the loss due to the high frequency signal that passes around to the second matching circuit 35 in the output matching circuit 15 can be reduced, and hence characteristics such as the high output power and high efficiency can be realized in the case where the output power is high. At the same time, the high frequency signal does not pass around to the second matching circuit 35, and hence the oscillation generated by a feedback of the high frequency signal amplified by the high output power last phase amplifying element 11 to the input side via the low output power last phase amplifying element 12 that is turned off can be suppressed in the case where the output power is high. In other words, isolation between the input and the output of the circuit on a side of the low output power last phase amplifying element 12 that is turned off can be enhanced so that the oscillation can be suppressed.

Here, a method of increasing Z24 that is impedance of the second matching circuit 35 viewed from the connection node 29 in the case where the output power is high is described. The output impedance Zout2 when the low output power last phase amplifying element 12 is turned off is capacitive impedance as illustrated in FIG. 12C, and hence the second matching circuit 35 can increase the impedance viewed from the connection node 29 by using a high pass filter type matching element such as the serial capacitor 17 or the parallel inductor 18. In view if this, the second circuit 35 includes the serial inductor 25 provided at a position that is closest to the connection node 29 from the fact that the impedance (Z23) is inductive. In this way, it is necessary to dispose the high pass filter type matching circuit 27 and the serial inductor 25 on the connection node 29 side of the second matching circuit 35.

The structure of the first matching circuit 34 of Embodiment 5 is difference from that of the first matching circuit 34 of Embodiment 3. However, it is understood from FIGS. 12B and 12D that Z16 that is impedance (first impedance) of the first matching circuit 34 viewed from the connection node 29 in the case where the output power is low is sufficiently higher than Z24 that is impedance (second impedance) of the second matching circuit 35 viewed from the connection node 29 in the case where the output power is low. Therefore, the above-mentioned "third condition" can be satisfied. Thus, the loss generated by the high frequency signal passing around to the first matching circuit 34 in the output matching circuit 15 can be reduced, and hence characteristics such as the high output power and high efficiency can be realized in the case where the output power is low. At the same time, the high frequency signal does not pass around to the first matching circuit 34, and hence the oscillation generated by a feedback of the high frequency signal amplified by the low output power last phase amplifying element 12 to the input side via the high output power last phase amplifying element 11 that is turned off can be suppressed in the case where the output power is low. In other words, isolation between the input and the output of the circuit on a side of the high output power last phase amplifying element 11 that is turned off can be enhanced, and hence the oscillation can be suppressed.

Here, a method of increasing the impedance Z16 of the first matching circuit 34 viewed from the connection node 29 in the case where the output power is low is described. The output impedance Zout1 when the high output power last phase amplifying element 11 is turned off is capacitive impedance as illustrated in FIG. 12B, and hence the first matching circuit 34 can increase the impedance (Z11) by providing a short stub. This short stub is made up of the collector (drain) bias line 23 and the bypass capacitor 24. However, the impedance (Z13) is decreased because of the low pass filter type matching circuit 30 that is provided for matching in the case where the high output power last phase amplifying element 11 is turned on, but the impedance is capacitive one because the low pass filter type matching circuit 30 is a single stage. Therefore, the first matching circuit 34 can increase the impedance viewed from the connection node 29 by using the high pass filter type matching element such as the serial capacitor 17 or the parallel inductor 18. In view of this, the impedance is inductive, and hence the serial inductor 25 of the first matching circuit 34 is disposed at the position that is closest to the connection node 29. In this way, it is necessary to dispose the high pass filter type matching circuit 27 and the serial inductor 25 on the connection node 29 side of the first matching circuit 34.

In addition, the high frequency amplifier 100 according to Embodiment 5 is compared with the high frequency amplifier 100 according to the above-mentioned Embodiment 3 as follows. The low pass filter type matching circuit 30 of Embodiment 3 has a two-stage structure while the low pass filter type matching circuit 30 of Embodiment 5 is a single stage, and the high pass filter type matching circuit 27 is disposed at the position close to the connection node 29 instead of the single stage low pass filter type matching circuit. Therefore, the impedance Z16 of the first matching circuit 34 on the side of the high output power last phase amplifying element 11 to be turned off viewed from the connection node 29 in the case where the output power is low can be higher than that in Embodiment 3 illustrated in FIG. 8B. Therefore, a loss generated by the high frequency signal passing around to the first matching circuit 34 in the output matching circuit 15 can be further reduced in the case where the output power is low, and hence the output power and the efficiency can be further enhanced in the case where the output power is low. At the same time, the high frequency signal does not pass around to the first matching circuit 34, and hence the oscillation generated by a feedback of the high frequency signal amplified by the low output power last phase amplifying element 12 to the input side via the high output power last phase amplifying element 11 that is turned off can be further suppressed in the case where the output power is low. In other words, the isolation between the input and the output of the circuit on the side of the high output power last phase amplifying element 11 that is turned off can be further enhanced, and hence the oscillation can be further suppressed.

According to Embodiment 5, the high frequency amplifier 100 illustrated in FIG. 11 includes the first matching circuit 34 disposed on the output side of the high output power last phase amplifying element 11, the second matching circuit 35 disposed on the output side of the low output power last phase amplifying element 12 and the third matching circuit 36 disposed on the post stage thereof. Therefore, it can be matched to the characteristic impedance of 50 ohms (Ω) in any cases of high and low output powers, and hence characteristics such as the high output power and high efficiency can be realized as the high frequency amplifier.

In addition, the impedance of the matching circuit on the turned-off amplifying element side viewed from the connection node 29 can be sufficiently higher than the impedance of the matching circuit on the turned-on amplifying element side viewed from the connection node 29 in any cases of high and low output powers. Therefore, it is possible to prevent the amplified high frequency signal from passing around to the matching circuit on the turned-off amplifying element side, and hence a loss in the output matching circuit 15 can be reduced, whereby characteristics such as the high output power and high efficiency can be realized as the high frequency amplifier. Further, isolation between the input and the output on the turned-off amplifying element side can be enhanced, and the oscillation due to the signal passing around the turned-off amplifying element can be suppressed.

Further, the impedance of the first matching circuit 34 viewed from the connection node 29 can be further increased in the case where the output power is low. The loss generated by the high frequency signal passing around to the first matching circuit 34 can be further reduced in the output matching circuit 15, and hence the output power and the efficiency can be further enhanced in the case where the output power is low. In addition, the isolation between the input and the output of the circuit on the side of the high output power last phase amplifying element 11 that is turned off can be further enhanced, and hence the oscillation can be further suppressed.

Note that the circuit described in Embodiment 5 is made up mainly of lumped constant elements, but the serial inductor 25 may be made up of a serial line, the parallel capacitor 22 may be made up of an open stub, and the parallel inductor may be made up of a short stub. The amplifying elements 11 and 12 are made up of a heterobipolar transistor (HBT), but may be made up of another bipolar transistor or a field effect transistor (FET) such as a metal-semiconductor FET (MESFET) or a high electron mobility transistor (HEMT). Further, the collector (drain) bias applying inductor 26 may be used instead of the collector (drain) bias line 23, and vice versa. Specifically, the collector (drain) bias line 23 may be used instead of the collector (drain) bias applying inductor 26. In addition, the collector (drain) bias line 23 and the collector (drain) bias applying inductor 26 work also as matching elements.

Embodiment 6

Figure 13:
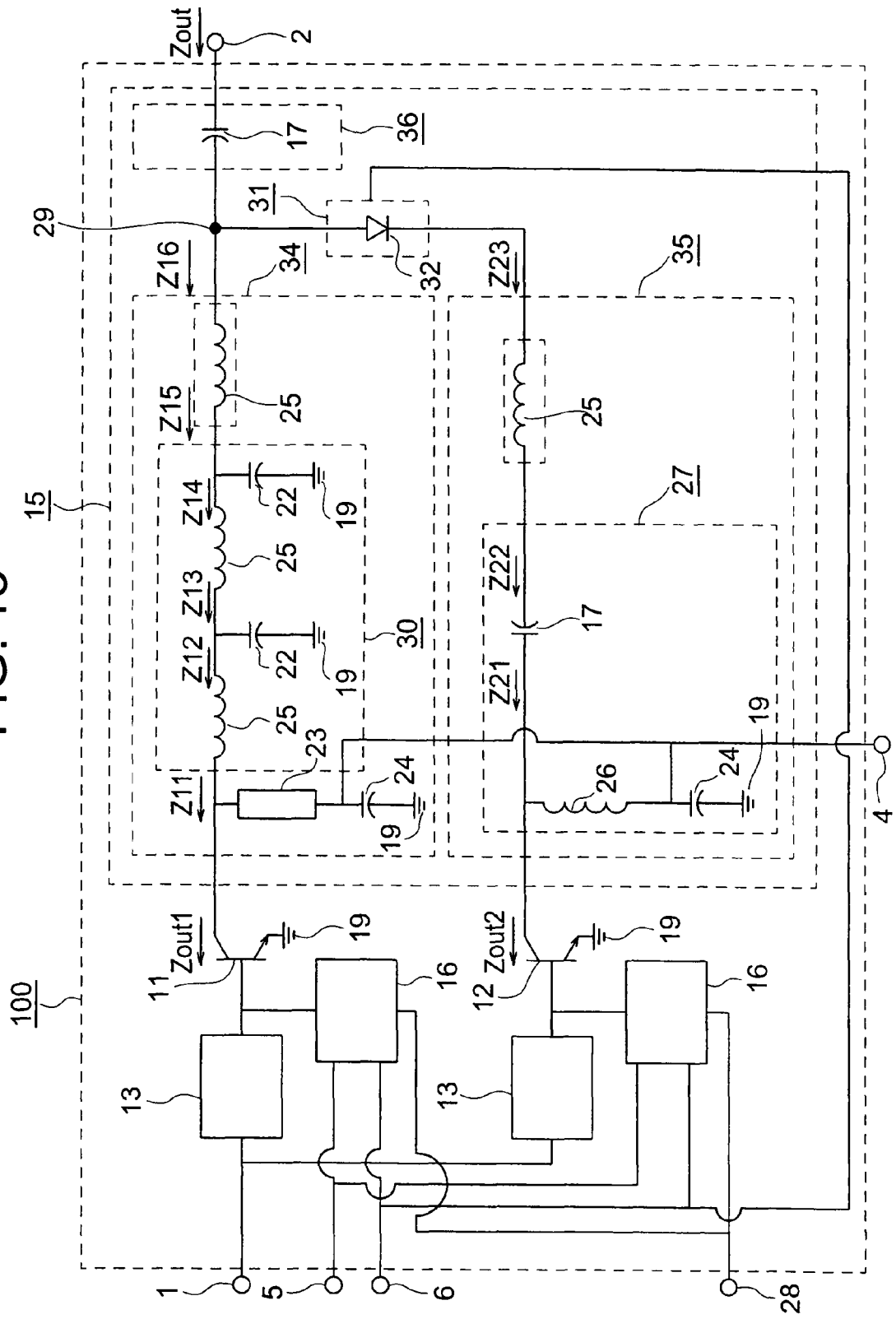
FIG. 13 is a circuit diagram illustrating a structure of a high frequency amplifier according to Embodiment 6 of the present invention.

A high frequency amplifier according to Embodiment 6 of the present invention is described with reference to FIG. 13. FIG. 13 is a circuit diagram illustrating a structure of the high frequency amplifier according to Embodiment 6 of the present invention.

In FIG. 13, a high frequency amplifier 100 according to Embodiment 6 includes an input terminal 1, an output terminal 2, a collector (drain) bias terminal 4, a base (gate) bias setting terminal 5, and a mode switching terminal 6.

In addition, the high frequency amplifier 100 includes a high output power last phase amplifying element (first amplifying element) 11, a low output power last phase amplifying element (second amplifying element) 12, two input matching circuits 13, an output matching circuit 15, and two base (gate) bias control circuits (first and second bias control circuits) 16.

An element size of the high output power last phase amplifying element 11 is larger than a size of the low output power last phase amplifying element 12. Note that each of the two base (gate) bias control circuits 16 is connected to a power source terminal 28.

The output matching circuit 15 includes a first matching circuit 34, a second matching circuit 35, a third matching circuit 36 and a switch 31. Note that the first and second matching circuits 34 and 35 are connected to the third matching circuit 36 via a connection node 29 and via the switch 31 and the connection node 29, respectively.

The first matching circuit 34 includes a short stub made up of a collector (drain) bias line 23 and a bypass capacitor 24, a low pass filter type matching circuit 30, and a serial inductor (first serial inductor) 25. In addition, the low pass filter type matching circuit 30 includes two stages of circuits made up of the serial inductor 25 and a parallel capacitor 22. Note that an end of each of the bypass capacitor 24 and parallel capacitor 22 is connected to a ground 19.

The second matching circuit 35 includes a high pass filter type matching circuit 27 and a serial inductor (second serial inductor) 25. In addition, the high pass filter type matching circuit 27 includes a collector (drain) bias applying inductor 26, the bypass capacitor 24, and a serial capacitor 17. Note that an end of the bypass capacitor 24 is connected to the ground 19.

The third matching circuit 36 includes the serial capacitor 17.

The high frequency amplifier 100 illustrated in FIG. 13 is different from the high frequency amplifier 100 illustrated in FIG. 7 only in that the switch 31 made up of a diode 32 is disposed between the second matching circuit 35 and the connection node 29.

Next, an operation of the high frequency amplifier according to Embodiment 6 is described with reference to the drawings.

Only the part that is different from the high frequency amplifier 100 of Embodiment 3 illustrated in FIG. 7 is described. The high frequency amplifier 100 according to Embodiment 6 includes the switch 31 made up of the diode 32 disposed between the second matching circuit 34 and the connection node 29. This switch 31 is controlled by the voltage that is applied to the mode switching terminal 6 so as to be turned off in the case where the output power is high and to be turned on in the case where the output power is low.

Therefore, the impedance of the second matching circuit 35 viewed from the connection node 29 in the case where the output power is high can be further increased because the switch 31 is turned off. Thus, the loss due to the high frequency signal that passes around to the second matching circuit 35 in the output matching circuit 15 can be reduced, and hence characteristics such as the high output power and high efficiency can be realized in the case where the output power is high. At the same time, the high frequency signal does not pass around to the second matching circuit 35, and hence the oscillation generated by a feedback of the high frequency signal amplified by the high output power last phase amplifying element 11 to the input side via the low output power last phase amplifying element 12 that is turned off can be further suppressed in the case where the output power is high. In other words, isolation between the input and the output of the circuit on a side of the low output power last phase amplifying element 12 that is turned off can be further enhanced so that the oscillation can be further suppressed.

According to Embodiment 6, the high frequency amplifier 100 of FIG. 13 can have the following effect in addition to the effect of the high frequency amplifier 100 of Embodiment 3 illustrated in FIG. 7. The loss generated by the high frequency signal that passes around to the second matching circuit 35 in the output matching circuit 15 can be reduced in the case where the output power is high, and hence characteristics such as the high output power and high efficiency can be realized in the case where the output power is high. At the same time, the high frequency signal does not pass around to the second matching circuit 35, and hence the oscillation generated by the feedback of the high frequency signal amplified by the high output power last phase amplifying element 11 to the input side via the low output power last phase amplifying element 12 that is turned off can be further suppressed in the case where the output power is high. In other words, the isolation between the input and the output of the circuit on the side of the low output power last phase amplifying element 12 that is turned off can be further enhanced, and hence the oscillation can be further suppressed.

The case where the switch 31 made up of the diode 32 is applied to Embodiment 3 (FIG. 7) is described in Embodiment 6, and the same effect can be obtained in the case where it is applied to Embodiment 1 (FIG. 1), Embodiment 2 (FIG. 5), Embodiment 4 (FIG. 9) or Embodiment 5 (FIG. 11). In addition, the case where the diode 32 is used as the switch 31 is described in Embodiment 6, but another switch such as an FET switch or a mechanical switch may be used as the switch 31.

The amplifying elements 11 and 12 are made up of a heterobipolar transistor (HBT), but may be made up of another bipolar transistor or a field effect transistor (FET) such as a metal-semiconductor FET (MESFET) or a high electron mobility transistor (HEMT). Further, the collector (drain) bias applying inductor 26 may be used instead of the collector (drain) bias line 23, and vice versa. Specifically, the collector (drain) bias line 23 may be used instead of the collector (drain) bias applying inductor 26. In addition, the collector (drain) bias line 23 and the collector (drain) bias applying inductor 26 work also as matching elements.

Embodiment 7

Figure 14:
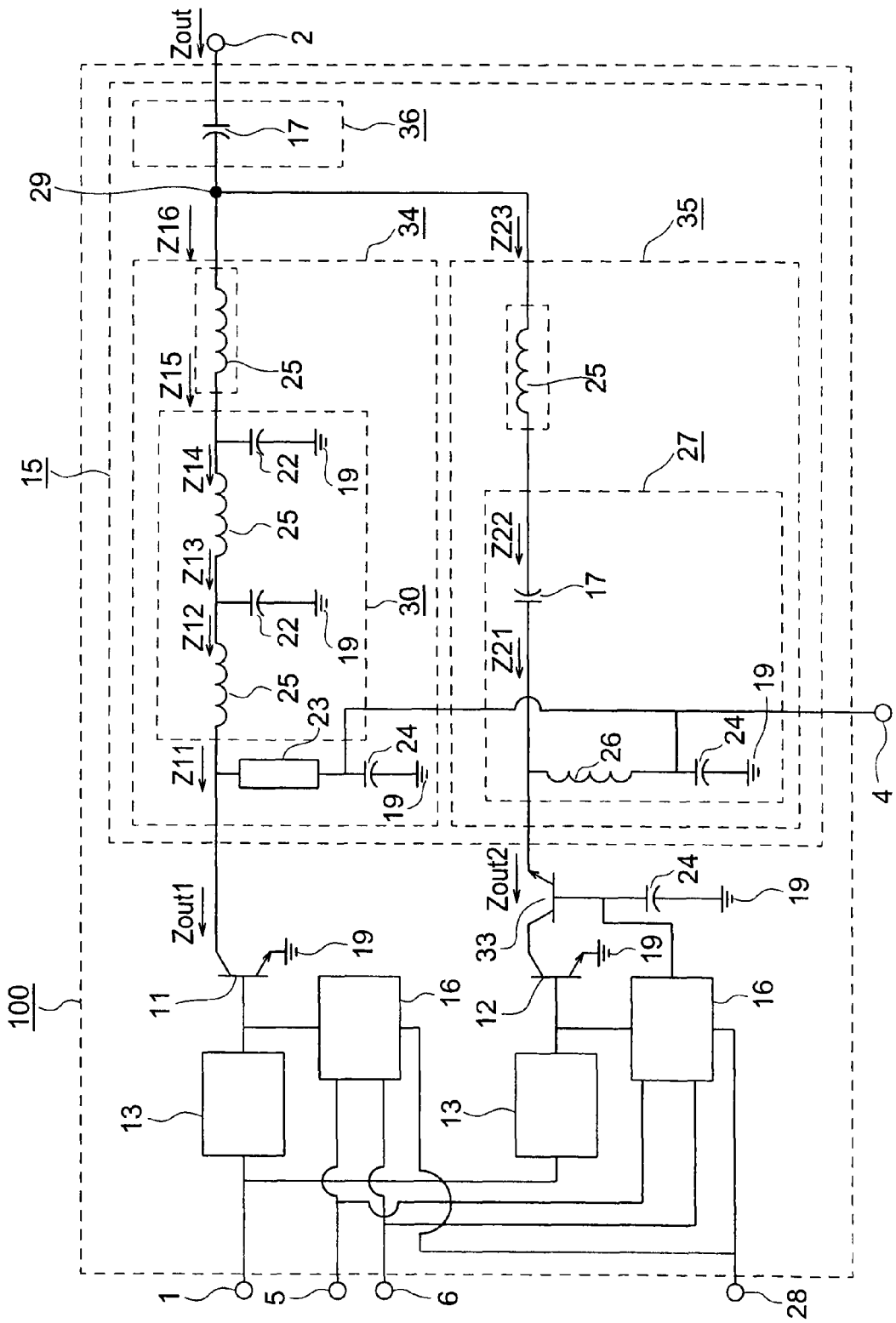
FIG. 14 is a circuit diagram illustrating a structure of a high frequency amplifier according to Embodiment 7 of the present invention.

A high frequency amplifier according to Embodiment 7 of the present invention is described with reference to FIG. 14. FIG. 14 is a circuit diagram illustrating a structure of the high frequency amplifier according to Embodiment 7 of the present invention.

In FIG. 14, a high frequency amplifier 100 according to Embodiment 7 includes an input terminal 1, an output terminal 2, a collector (drain) bias terminal 4, a base (gate) bias setting terminal 5, and a mode switching terminal 6.

In addition, the high frequency amplifier 100 includes a high output power last phase amplifying element (first amplifying element) 11, a low output power last phase amplifying element (second amplifying element) 12, two input matching circuits 13, an output matching circuit 15, two base (gate) bias control circuits (first and second bias control circuits) 16, and a grounded base (gate) transistor (third amplifying element) 33. An element size of the high output power last phase amplifying element 11 is larger than a size of the low output power last phase amplifying element 12. Note that each of the two base (gate) bias control circuits 16 is connected to a power source terminal 28.

The output matching circuit 15 includes a first matching circuit 34, a second matching circuit 35, and a third matching circuit 36. Note that the first and second matching circuits 34 and 35 are connected to the third matching circuit 36 via a connection node 29.

The first matching circuit 34 includes a short stub made up of a collector (drain) bias line 23 and a bypass capacitor 24, a low pass filter type matching circuit 30, and a serial inductor (first serial inductor) 25. In addition, the low pass filter type matching circuit 30 includes two stages of circuits made up of the serial inductor 25 and a parallel capacitor 22. Note that an end of each of the bypass capacitor 24 and parallel capacitor 22 is connected to a ground 19.

The second matching circuit 35 includes a high pass filter type matching circuit 27 and a serial inductor (second serial inductor) 25. In addition, the high pass filter type matching circuit 27 includes a collector (drain) bias applying inductor 26, the bypass capacitor 24, and a serial capacitor 17. Note that an end of the bypass capacitor 24 is connected to the ground 19.

The third matching circuit 36 includes the serial capacitor 17.

The high frequency amplifier 100 illustrated in FIG. 14 is different from the high frequency amplifier 100 illustrated in FIG. 7 only in that the grounded base (gate) transistor 33 is inserted, which is connected in cascode to the output side of the low output power last phase amplifying element 12.

Next, an operation of the high frequency amplifier according to Embodiment 7 is described with reference to the drawings.

Only the part that is different from the high frequency amplifier 100 of Embodiment 3 illustrated in FIG. 7 is described. In the high frequency amplifier 100 of Embodiment 7 illustrated in FIG. 14, the grounded base (gate) transistor 33 is inserted to the output side of the low output power last phase amplifying element 12. A base voltage of the grounded base (gate) transistor 33 is supplied from the base (gate) bias control circuit (second bias control circuit) 16. Then, the base (gate) bias control circuit 16 controls so that the grounded base (gate) transistor 33 is turned off in the case where the output power is high while the grounded base (gate) transistor 33 is turned on in the case where the output power is low, by the voltage from the mode switching terminal 6.

Therefore, the signal passing around to the low output power last phase amplifying element 12 via the second matching circuit 35 is cut off by the turned-off grounded base (gate) transistor 33 in the case where the output power is high. Thus, the oscillation generated by the feedback of the high frequency signal amplified by the high output power last phase amplifying element 11 to the input side via the low output power last phase amplifying element 12 that is turned off can be further suppressed. In other words, the isolation between the input and the output of the circuit on the side of the low output power last phase amplifying element 12 that is turned off can be further enhanced, and hence the oscillation can be further suppressed.

According to Embodiment 7, the high frequency amplifier 100 illustrated in FIG. 14 can have the following effect in addition to the effect of the high frequency amplifier 100 of Embodiment 3 illustrated in FIG. 7. The signal passing around to the low output power last phase amplifying element 12 via the second matching circuit 35 can be cut off by the turned-off grounded base (gate) transistor 33 in the case where the output power is high, and hence the oscillation generated by the feedback of the high frequency signal amplified by the high output power last phase amplifying element 11 to the input side via the low output power last phase amplifying element 12 that is turned off can be further suppressed. In other words, the isolation between the input and the output of the circuit on the side of the low output power last phase amplifying element 12 that is turned off can be further enhanced, and hence the oscillation can be further suppressed.

The case where the grounded base (gate) transistor 33 is applied to the high frequency amplifier 100 of Embodiment 3 illustrated in FIG. 7 is described in Embodiment 7, and the same effect can be obtained in the case where it is applied to the high frequency amplifier 100 of Embodiment 1 (FIG. 1), Embodiment 2 (FIG. 5), Embodiment 4 (FIG. 9), Embodiment 5 (FIG. 11) or Embodiment 6 (FIG. 13).

The amplifying elements 11 and 12 are made up of a heterobipolar transistor (HBT), but may be made up of another bipolar transistor or a field effect transistor (FET) such as a metal-semiconductor FET (MESFET) or a high electron mobility transistor (HEMT). Further, the collector (drain) bias applying inductor 26 may be used instead of the collector (drain) bias line 23, and vice versa. Specifically, the collector (drain) bias line 23 may be used instead of the collector (drain) bias applying inductor 26. In addition, the collector (drain) bias line 23 and the collector (drain) bias applying inductor 26 work also as matching elements.

Embodiment 8

Figure 15:
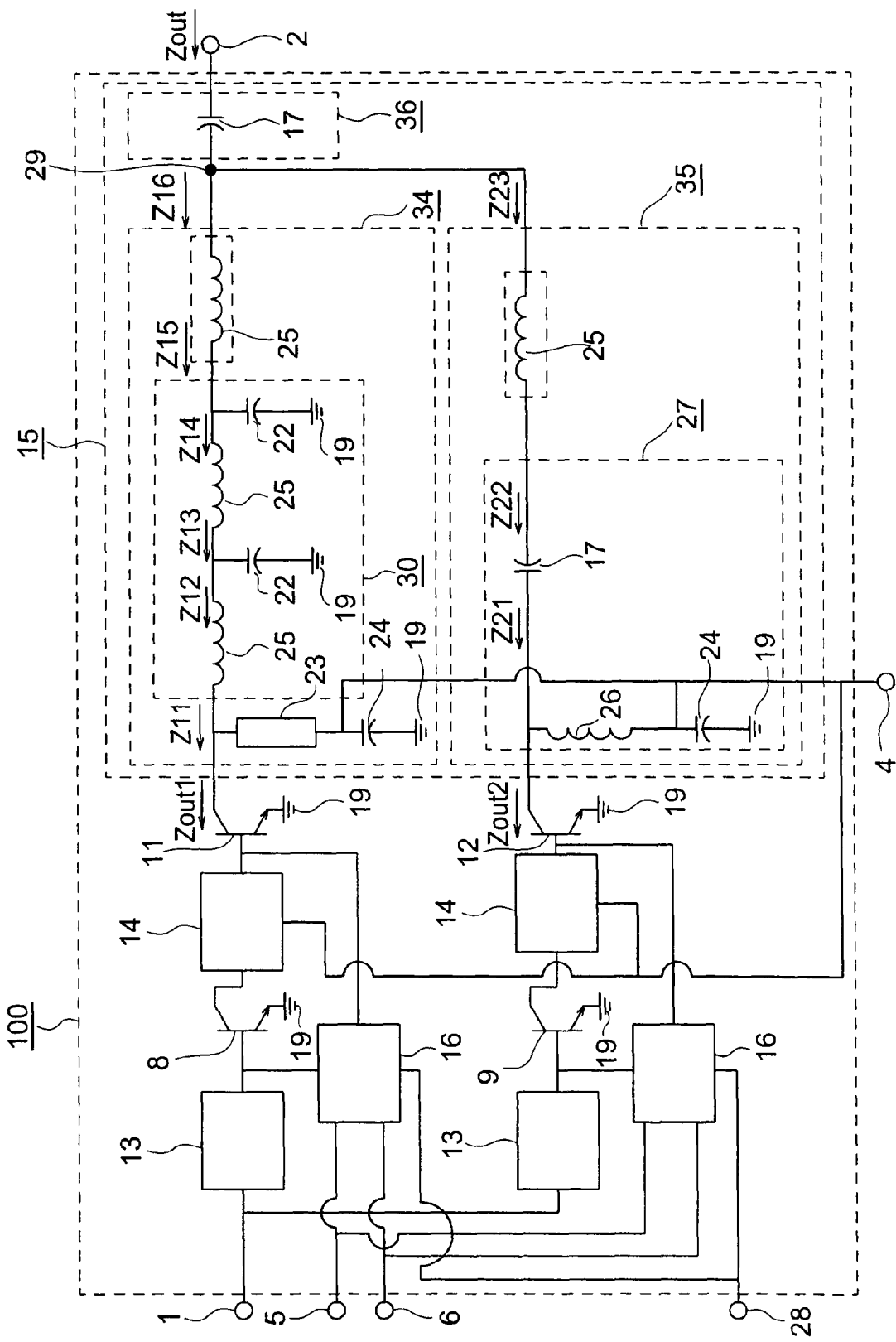
FIG. 15 is a circuit diagram illustrating a structure of a high frequency amplifier according to Embodiment 8 of the present invention.

A high frequency amplifier according to Embodiment 8 of the present invention is described with reference to FIG. 15. FIG. 15 is a circuit diagram illustrating a structure of the high frequency amplifier according to Embodiment 8 of the present invention.

In FIG. 15, a high frequency amplifier 100 according to Embodiment 8 includes an input terminal 1, an output terminal 2, a collector (drain) bias terminal 4, a base (gate) bias setting terminal 5, and a mode switching terminal 6.

In addition, the high frequency amplifier 100 includes a high output power last phase amplifying element (first amplifying element) 11, a low output power last phase amplifying element (second amplifying element) 12, two input matching circuits 13, an output matching circuit 15, two base (gate) bias control circuits (first and second bias control circuits) 16, a high output power pre-amplifying element (third amplifying element) 8, a low output power pre-amplifying element (fourth amplifying element) 9, and two interstage matching circuits (first and second interstage matching circuits) 14. An element size of the high output power last phase amplifying element 11 is larger than a size of the low output power last phase amplifying element 12. Note that each of the two base (gate) bias control circuits 16 is connected to a power source terminal 28.

The output matching circuit 15 includes a first matching circuit 34, a second matching circuit 35, and a third matching circuit 36. Note that the first and second matching circuits 34 and 35 are connected to the third matching circuit 36 via a connection node 29.

The first matching circuit 34 includes a short stub made up of a collector (drain) bias line 23 and a bypass capacitor 24, a low pass filter type matching circuit 30, and a serial inductor (first serial inductor) 25. In addition, the low pass filter type matching circuit 30 includes two stages of circuits made up of the serial inductor 25 and a parallel capacitor 22. Note that an end of each of the bypass capacitor 24 and parallel capacitor 22 is connected to a ground 19.

The second matching circuit 35 includes a high pass filter type matching circuit 27 and a serial inductor (second serial inductor) 25. In addition, the high pass filter type matching circuit 27 includes a collector (drain) bias applying inductor 26, the bypass capacitor 24, and a serial capacitor 17. Note that an end of the bypass capacitor 24 is connected to the ground 19.

The third matching circuit 36 includes the serial capacitor 17.

The high frequency amplifier 100 of Embodiment 8 illustrated in FIG. 15 is different from the high frequency amplifier 100 of Embodiment 3 illustrated in FIG. 7 only in that the high output power pre-amplifying element 8, the low output power pre-amplifying element 9 and the two interstage matching circuits 14 are added, and hence the amplifying element to be switched has a two-stage structure.

Next, an operation of the high frequency amplifier according to Embodiment 8 is described with reference to the drawings.

Only the part that is different from the high frequency amplifier 100 of Embodiment 3 illustrated in FIG. 7 is described. The collector (drain) bias is supplied to the high output power pre-amplifying element 8 and to the low output power pre-amplifying element 9 via the interstage matching circuits 14 from the collector (drain) bias terminal 4. The base (gate) bias is supplied to the high output power pre-amplifying element 8 and to the low output power pre-amplifying element 9 from the two base (gate) bias control circuits 16, respectively.

According to Embodiment 8, the high frequency amplifier 100 illustrated in FIG. 15 can obtain a much higher gain in addition to the effect of the high frequency amplifier 100 of Embodiment 3 illustrated in FIG. 7. In addition, considering as two stages of amplifiers, not only the last phase amplifying element 12 but also the pre-amplifying element 9 has a small size in the case where the output power is low. Therefore, power consumption can be further reduced, and hence higher efficiency characteristics can be realized.

The case where the two stages of the amplifying elements are applied to the high frequency amplifier of Embodiment 3 illustrated in FIG. 7 is described as the high frequency amplifier 100 of Embodiment 8 illustrated in FIG. 15, and the same effect can be obtained in the case where it is applied to the high frequency amplifier 100 of Embodiment 1 (FIG. 1), Embodiment 2 (FIG. 5), Embodiment 4 (FIG. 9), Embodiment 5 (FIG. 11), Embodiment 6 (FIG. 13) or Embodiment 7 (FIG. 14).

The amplifying elements 11 and 12 are made up of a heterobipolar transistor (HBT), but may be made up of another bipolar transistor or a field effect transistor (FET) such as a metal-semiconductor FET (MESFET) or a high electron mobility transistor (HEMT). Further, the collector (drain) bias applying inductor 26 may be used instead of the collector (drain) bias line 23, and vice versa. Specifically, the collector (drain) bias line 23 may be used instead of the collector (drain) bias applying inductor 26. In addition, the collector (drain) bias line 23 and the collector (drain) bias applying inductor 26 work also as matching elements.

The invention claimed is:
1. A high frequency amplifier, comprising:
a first amplifying element for amplifying a high frequency signal input from an input terminal;
a second amplifying element for amplifying the high frequency signal, which is connected in parallel to the first amplifying element and has a smaller element size than the first amplifying element has;
a first bias control circuit for turning on and off the first amplifying element based on a mode switching voltage for switching between a case where an output power is high and a case where the output power is low;

a second bias control circuit for turning on and off the second amplifying element based on the mode switching voltage; and an output matching circuit connected to output sides of the first amplifying element and the second amplifying element, the output matching circuit comprising:

a first matching circuit connected to the output side of the first amplifying element;

a second matching circuit connected to the output side of the second amplifying element; and a third matching circuit connected between an output terminal and a connection node of the output sides of the first matching circuit and the second matching circuit, which is matched to 50 ohms, wherein:

the first matching circuit comprises:

a low pass filter type matching circuit connected to the output side of the first amplifying element; and a first serial inductor connected to the low pass filter type matching circuit;

the second matching circuit comprises:

a high pass filter type matching circuit connected to the output side of the second amplifying element; and a second serial inductor connected to the high pass filter type matching circuit;

a first impedance of the first matching circuit viewed from the connection node in the case where the output power is high that is a case where the first amplifying element is turned on while the second amplifying element is turned off is substantially the same as a second impedance of the second matching circuit viewed from the connection node in the case where the output power is low that is a case where the second amplifying element is turned on while the first amplifying element is turned off;

the second impedance of the second matching circuit viewed from the connection node is higher than the first impedance of the first matching circuit viewed from the connection node in the case where the output power is high that is the case where the first amplifying element is turned on while the second amplifying element is turned off; and the first impedance of the first matching circuit viewed from the connection node is higher than the second impedance of the second matching circuit viewed from the connection node in the case where the output power is low that is the case where the second amplifying element is turned on while the first amplifying element is turned off.

2. A high frequency amplifier according to claim 1, wherein the low pass filter type matching circuit is connected to the output side of the first amplifying element, and comprises a two-stage circuit of a third serial inductor and a first parallel capacitor.

3. A high frequency amplifier according to claim 2, wherein the low pass filter type matching circuit further comprises a second parallel capacitor connected between the output side of the first amplifying element and the two-stage circuit.

* * * * *